United States Patent
Wu et al.

(10) Patent No.: US 12,374,592 B2
(45) Date of Patent: Jul. 29, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Cheng-Chieh Wu, Hsinchu (TW); Ting Hao Kuo, Hsinchu (TW); Kuo-Lung Pan, Hsinchu (TW); Po-Yuan Teng, Hsinchu (TW); Yu-Chia Lai, Miaoli County (TW); Shu-Rong Chun, Hsinchu (TW); Mao-Yen Chang, Kaohsiung (TW); Wei-Kang Hsieh, Hsinchu (TW); Pavithra Sriram, Hsinchu (TW); Hao-Yi Tsai, Hsinchu (TW); Po-Han Wang, Hsinchu (TW); Yu-Hsiang Hu, Hsinchu (TW); Hung-Jui Kuo, Hsinchu (TW)

(73) Assignee: Taiwan Semiconductor Manufacturing, Ltd., Hsinchu (TW)

(*) Notice: Subject to any disclaimer, the term of this patent is extended or adjusted under 35 U.S.C. 154(b) by 4 days.

(21) Appl. No.: 17/358,001

(22) Filed: Jun. 25, 2021

(65) Prior Publication Data
US 2022/0415737 A1    Dec. 29, 2022

(51) Int. Cl.
| H01L 23/31 | (2006.01) |
| H01L 21/48 | (2006.01) |
| H01L 21/56 | (2006.01) |
| H01L 23/00 | (2006.01) |
| H01L 23/29 | (2006.01) |

(Continued)

(52) U.S. Cl.
CPC .......... *H01L 23/31* (2013.01); *H01L 21/4853* (2013.01); *H01L 21/56* (2013.01); *H01L 23/293* (2013.01); *H01L 23/5384* (2013.01); *H01L 23/5386* (2013.01); *H01L 24/14* (2013.01); *H01L 25/0655* (2013.01)

(58) Field of Classification Search
CPC ... H01L 23/293; H01L 23/31; H01L 23/5384; H01L 23/5386; H01L 24/14
See application file for complete search history.

(56) References Cited

U.S. PATENT DOCUMENTS

| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Trang Q Tran
(74) *Attorney, Agent, or Firm* — JCIPRNET

(57) ABSTRACT

A semiconductor device includes semiconductor dies and a redistribution structure. The semiconductor dies are encapsulated in an encapsulant. The redistribution structure extends on the encapsulant and electrically connects the semiconductor dies. The redistribution structure includes dielectric layers and redistribution conductive layers alternately stacked. An outermost dielectric layer of the dielectric layers further away from the semiconductor dies is made of a first material. A first dielectric layer of the dielectric layers on which the outermost dielectric layer extends is made of a second material different from the first material. The first material includes at least one material selected from the group consisting of an epoxy resin, a phenolic resin, a polybenzooxazole, and a polyimide having a curing temperature lower than 250° C.

14 Claims, 27 Drawing Sheets

(51) Int. Cl.
    *H01L 23/538*     (2006.01)
    *H01L 25/065*     (2023.01)

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2012/0018194 A1* | 1/2012 | Maeda ................ H05K 3/0035 174/251 |
| 2013/0299967 A1* | 11/2013 | Daniels ................ H01L 24/05 438/689 |
| 2015/0279776 A1* | 10/2015 | Hu ................ H01L 21/31127 257/668 |
| 2016/0276237 A1* | 9/2016 | Lin ................ H01L 21/561 |

* cited by examiner

SEMICONDUCTOR DEVICE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance, more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
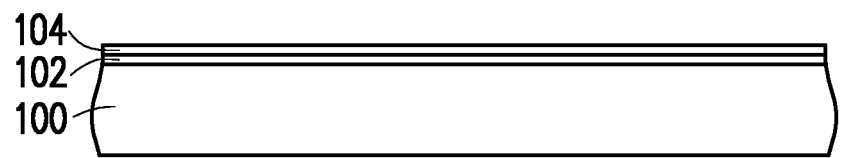
FIG. 1A to FIG. 1W are schematic cross-sectional views of structures produced at various stages of a manufacturing method of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
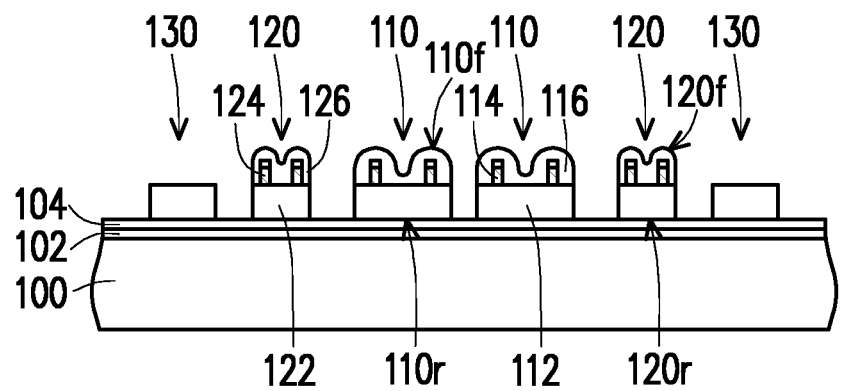
Figure 1C:
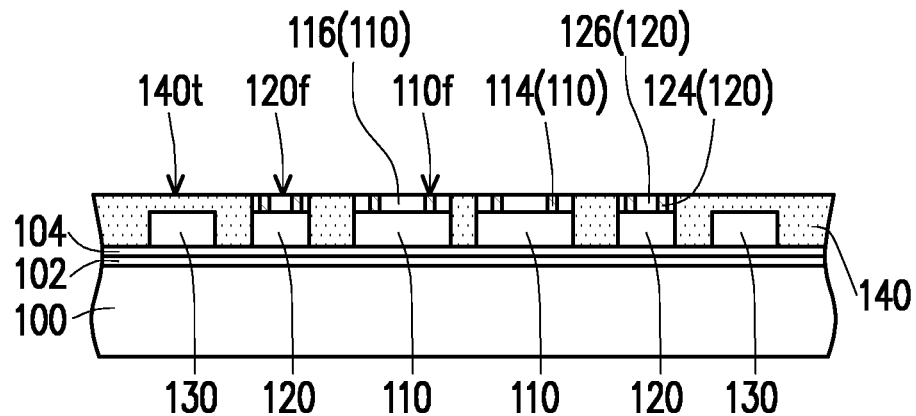
Figure 1D:
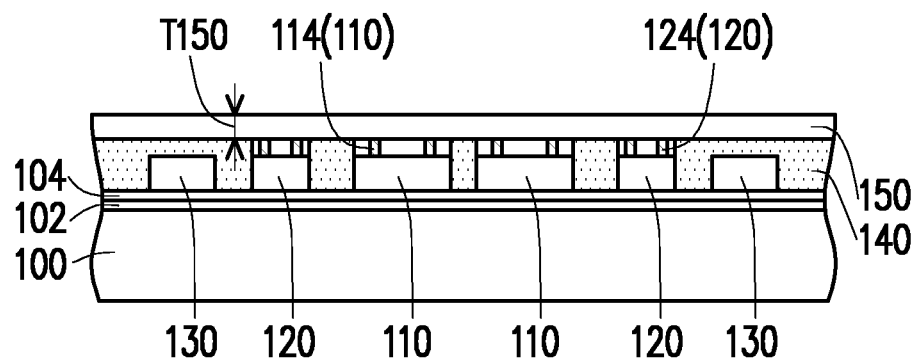
Figure 1E:
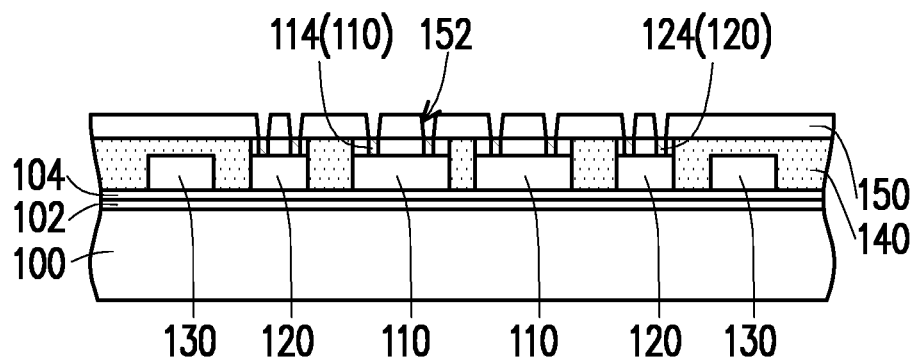
Figure 1F:
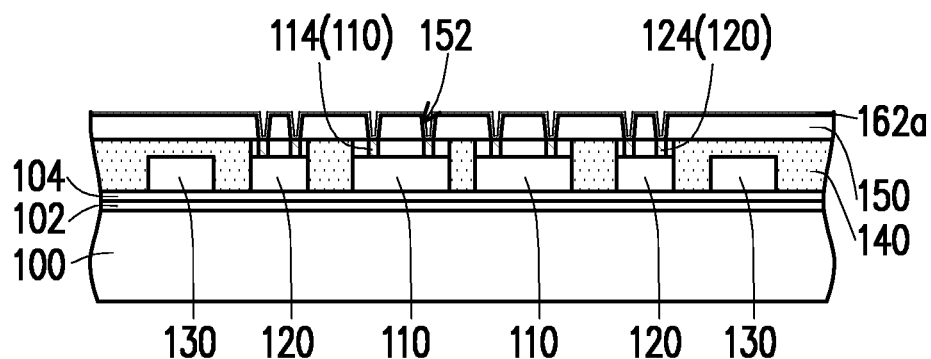
Figure 1G:
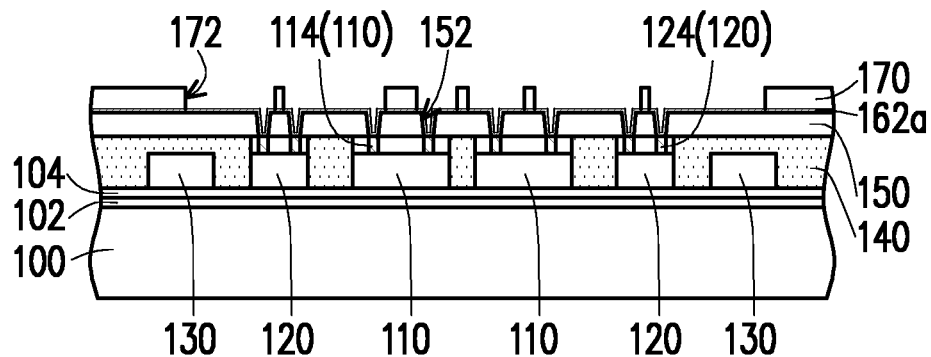
Figure 1H:
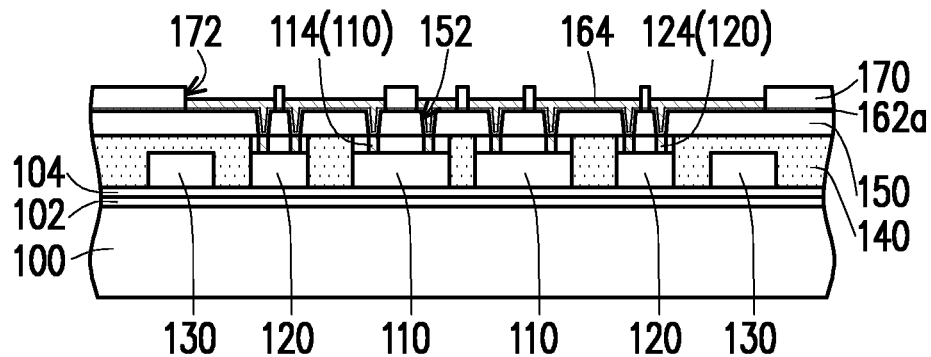
Figure 1I:
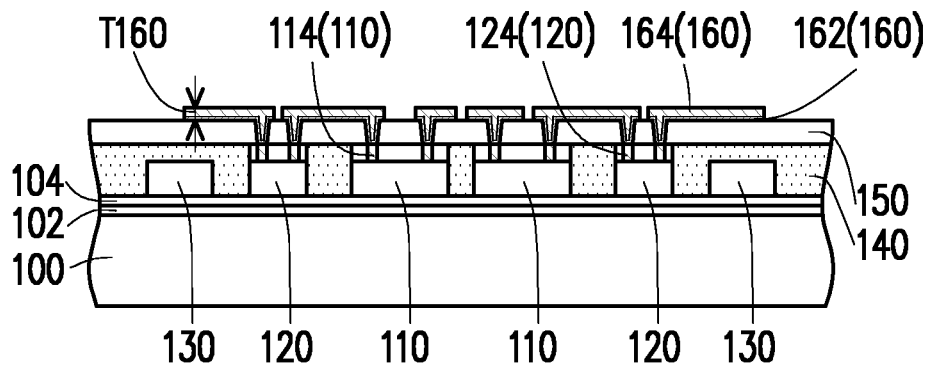
Figure 1J:
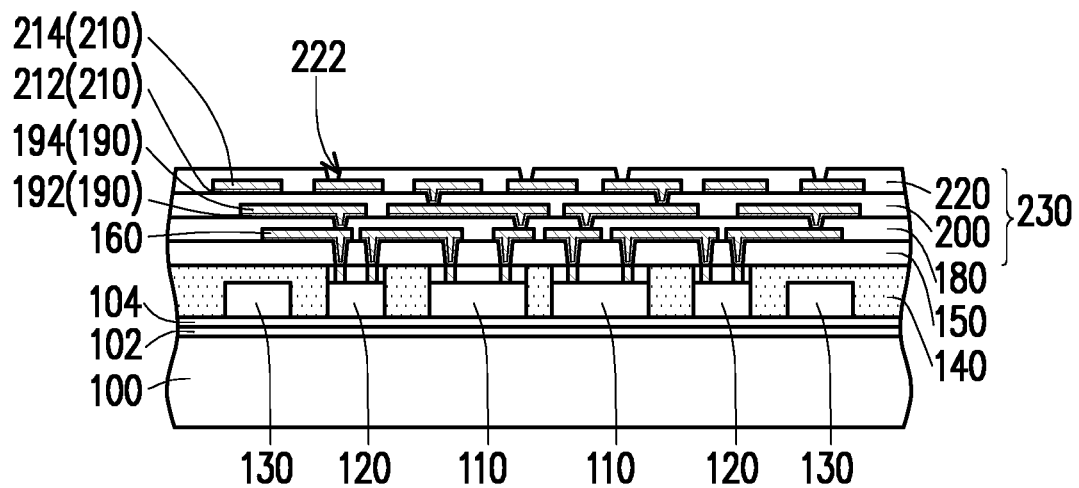
Figure 1K:
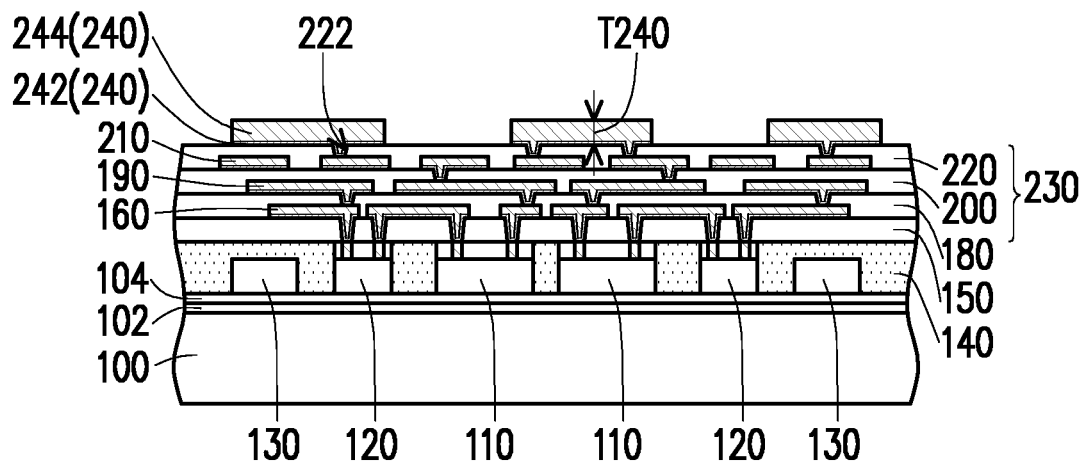
Figure 1L:
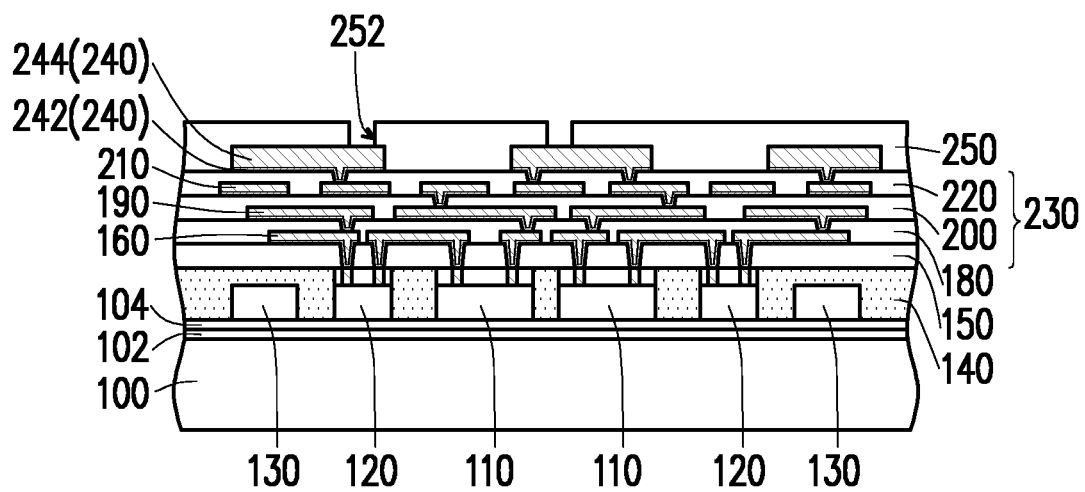
Figure 1M:
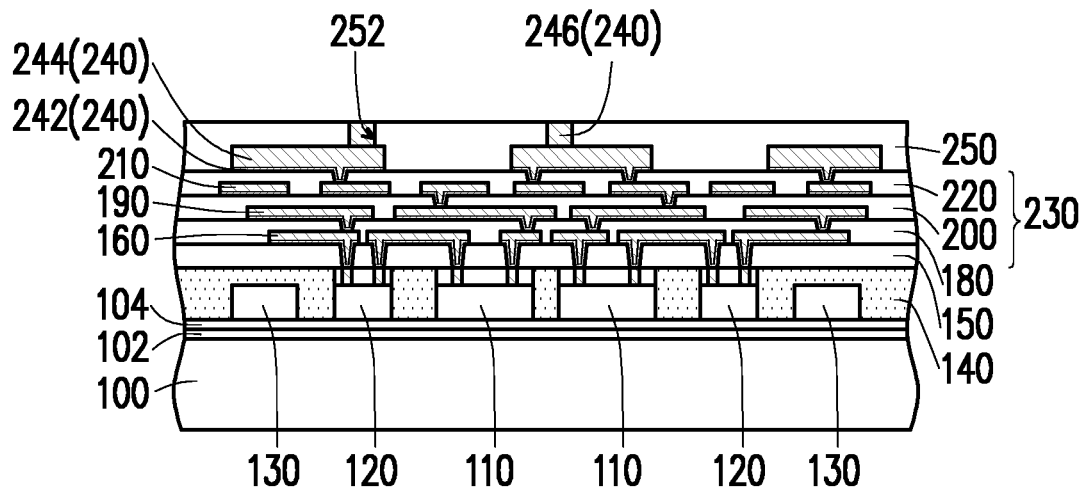
Figure 1N:
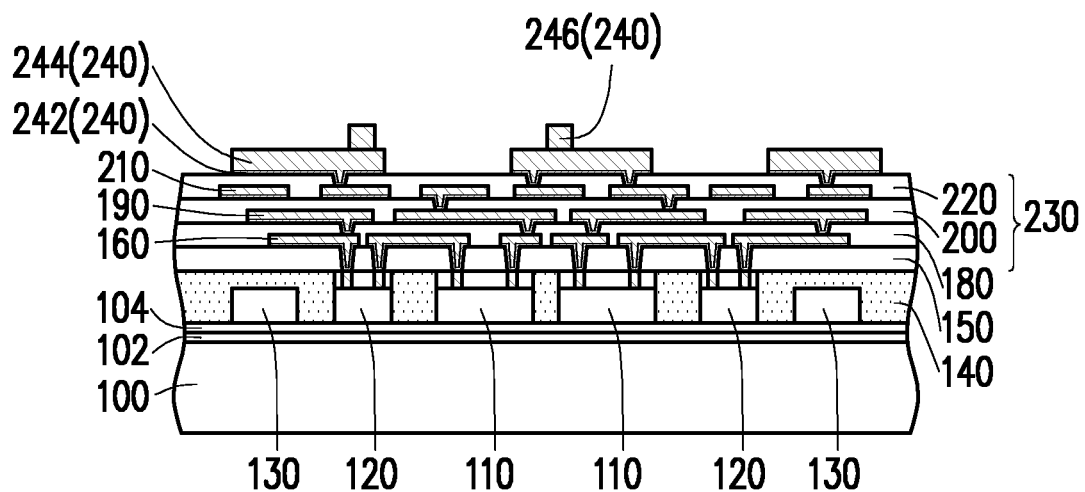
Figure 1O:
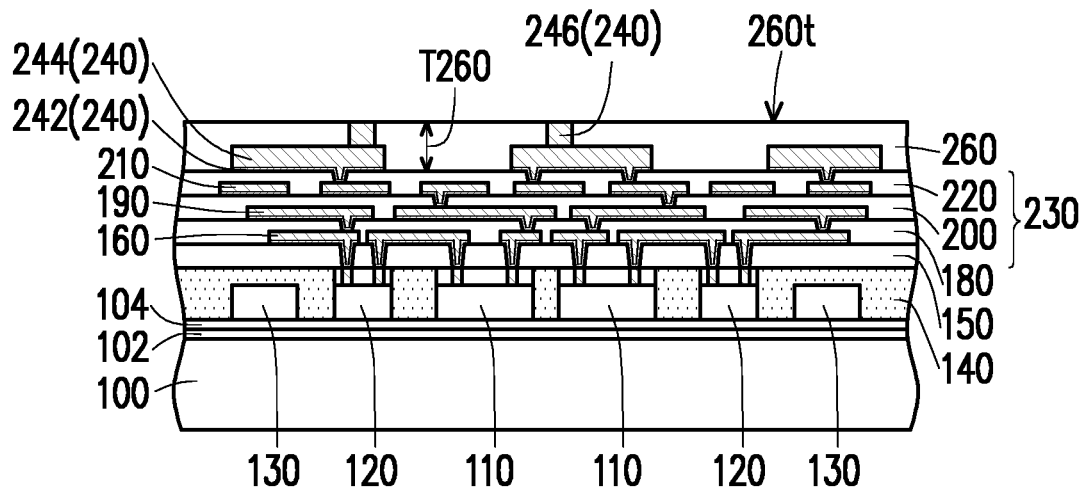
Figure 1P:
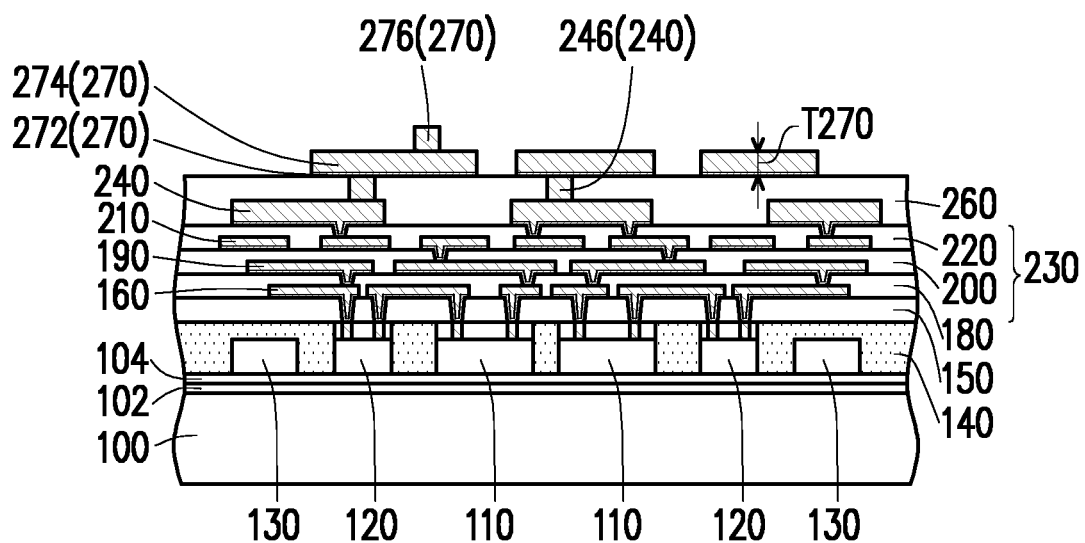
Figure 1Q:
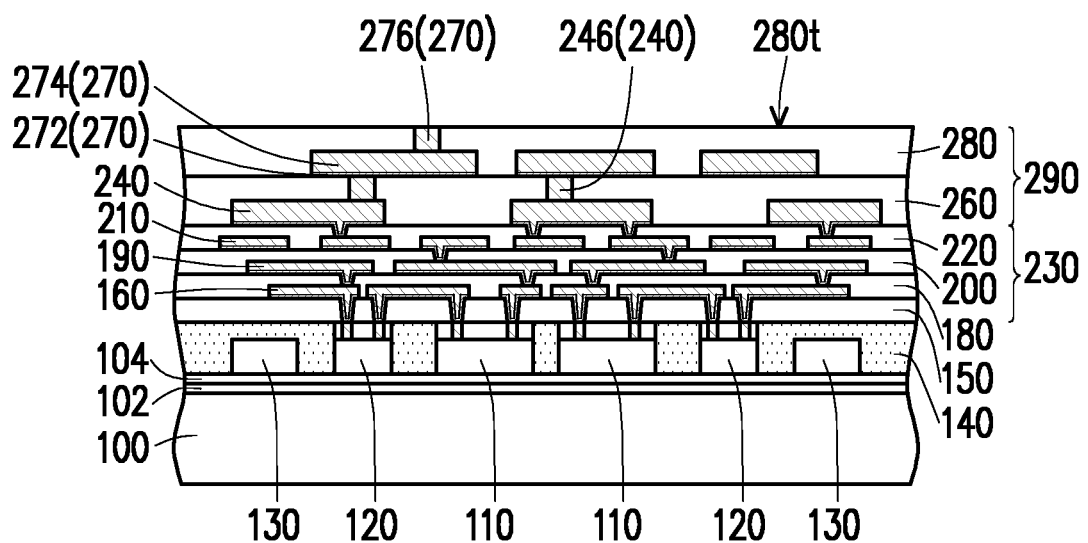
Figure 1R:
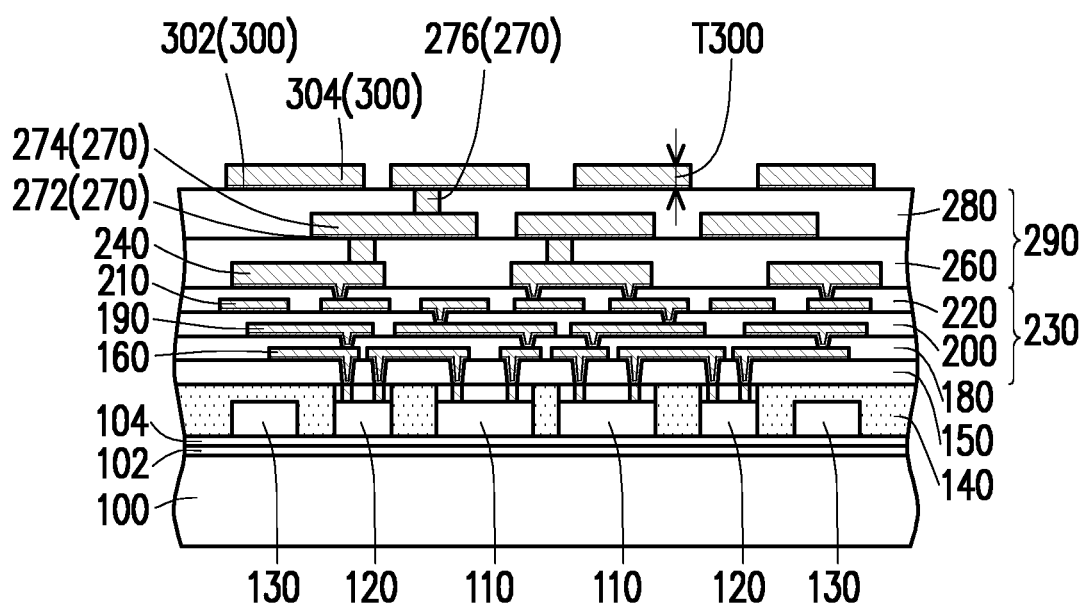
Figure 1S:
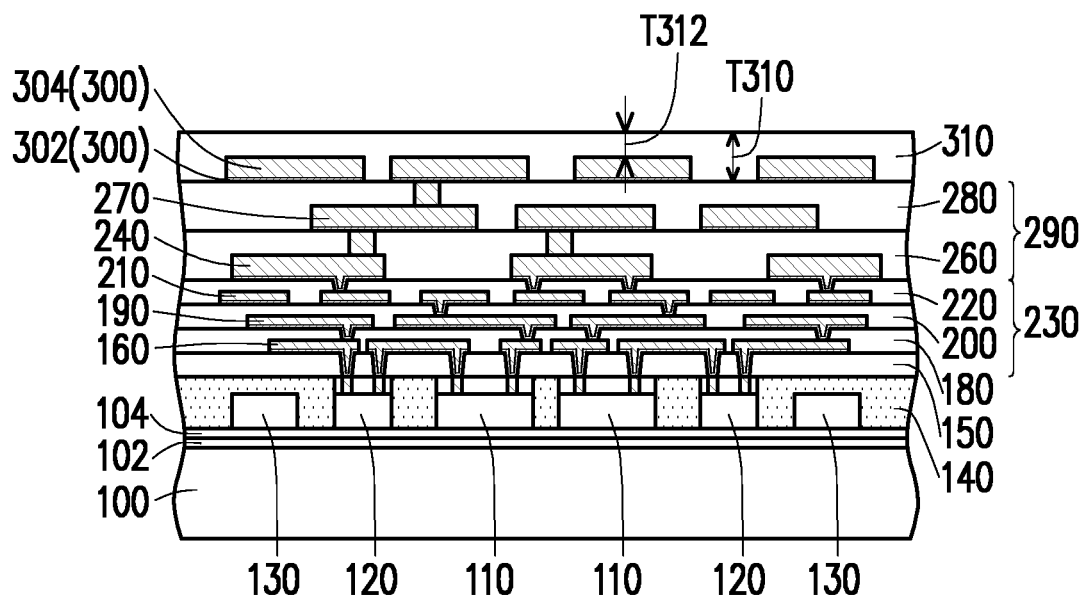
Figure 1T:
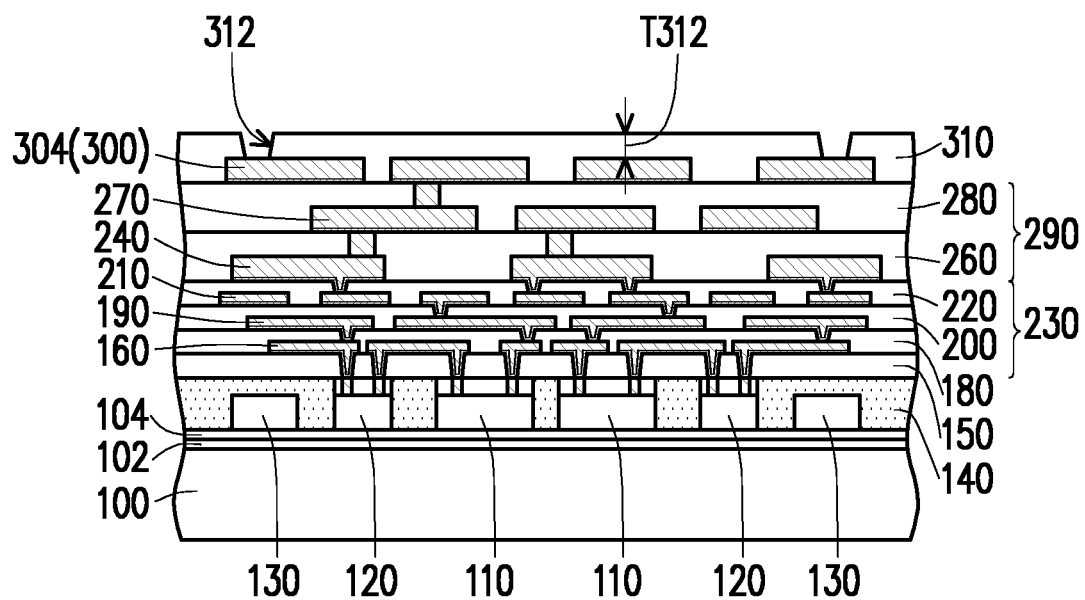
Figure 1U:
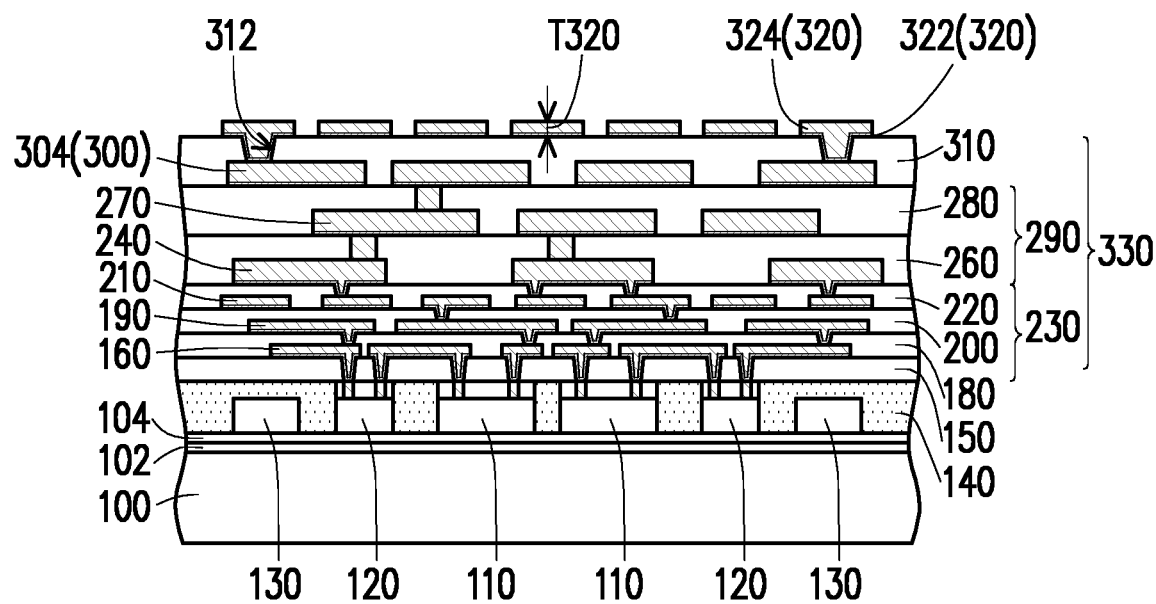
Figure 1V:
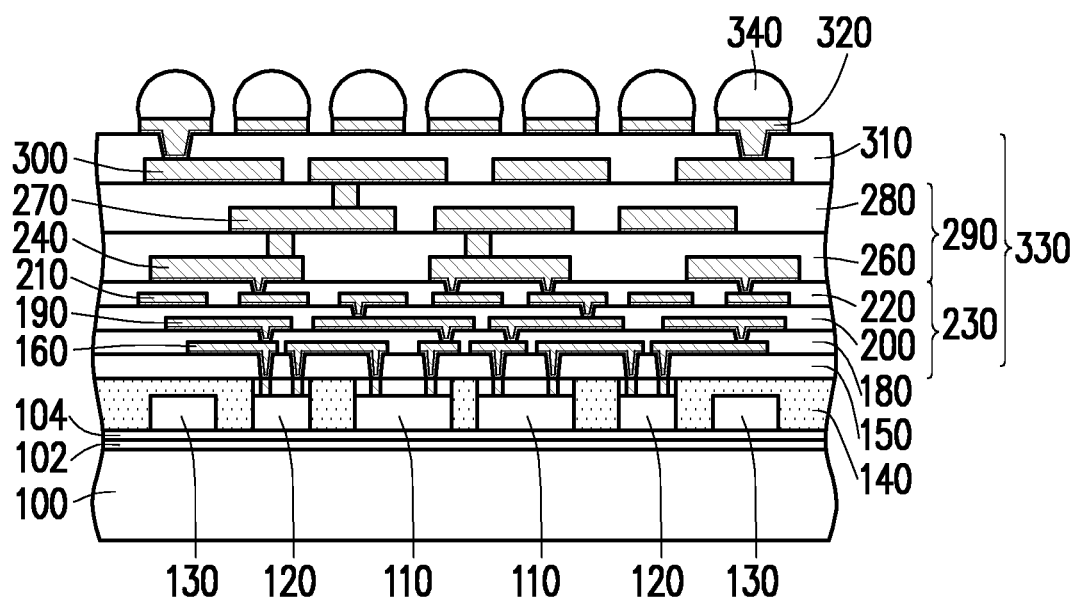
Figure 1W:
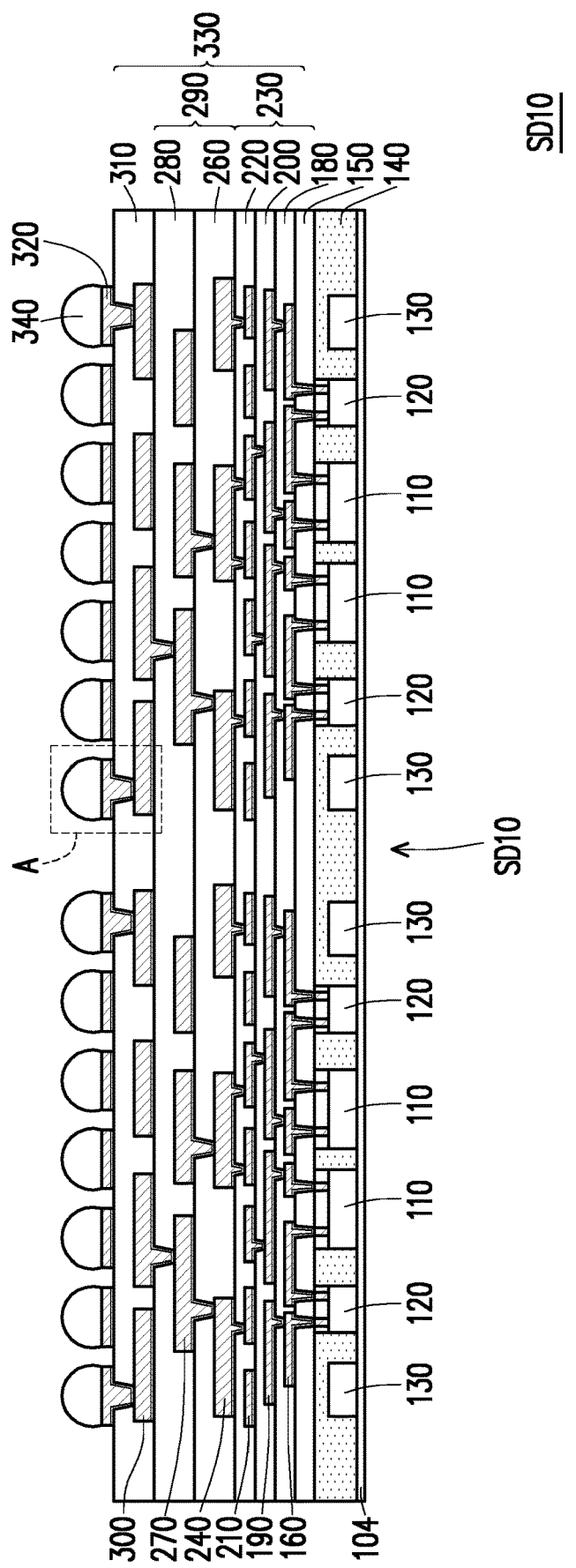

FIG. 1A through FIG. 1W are schematic cross-sectional views of structures produced at various stages of a manufacturing method of a semiconductor device SD10 according to some embodiments of the present disclosure. In FIG. 1A, a carrier 100 is provided. In some embodiments, the carrier 100 is a glass substrate, a metal plate, a plastic supporting board, or the like, but other suitable substrate materials may be used as long as the materials are able to withstand the subsequent steps of the process. In some embodiments, a de-bonding layer 102 is provided on the carrier 100 to facilitate peeling the carrier 100 away from the structure when required by the manufacturing process. In some embodiments, the de-bonding layer 102 includes a light-to-heat conversion (LTHC) release layer. In some embodiments, an adhesive layer 104 is formed on the carrier 100, for example via lamination. The adhesive layer 104 may include a die attach film material, such as a pressure adhesive, a thermally curable adhesive, or the like.

In some embodiments, referring to FIG. 1B, semiconductor dies 110, 120 are provided on the carrier 100. In some embodiments, the semiconductor dies 110, 120 are placed onto the carrier 100 through a pick-and-place method, for example during a sequence of placement steps. In some embodiments, the semiconductor dies 110, 120 are placed over the carrier 100 with the front surfaces 110f, 120f facing away from the carrier 100. Rear surfaces 110r, 120r opposite to the corresponding front surfaces 110f, 120f may be directed towards (and, possibly, in contact with) the adhesive layer 104.

In some embodiments, an individual semiconductor die 110 includes a semiconductor substrate 112, contact posts 114, and a protective layer 116. The contact posts 114 are formed at the front surface of the semiconductor substrate 112. The protective layer 116 covers the front surface of the semiconductor substrate 112 left exposed by the contact posts 114. In some embodiments, the protective layer 116 further extends on the contact posts 114, temporarily covering the contact posts 114 and constituting the front surface 110f of the semiconductor die 110.

The semiconductor substrate 112 may be made of semiconductor materials, such as semiconductor materials of the groups III-V of the periodic table. In some embodiments, the semiconductor substrate 112 include elemental semiconductor materials, such as crystalline silicon, diamond, or germanium; compound semiconductor materials such as silicon carbide, gallium arsenide, indium arsenide, or indium phosphide, or alloy semiconductor materials such as silicon germanium, silicon germanium carbide, gallium arsenic phosphide, or gallium indium phosphide. In some embodiments, the material of the contact posts 114 includes aluminum, copper, copper alloys, or other conductive materials, and may be formed by deposition, plating, or other suitable techniques. Caps may be temporarily formed on the contact posts 114. The protective layer 116 may be a single layer or a multi-layered structure, and may include silicon oxide, silicon nitride, silicon oxy-nitride, organic polymers (e.g., polyimide), other suitable dielectric materials, or combinations thereof. The protective layer 116 may be formed by suitable fabrication techniques such as spin-on coating, chemical vapor deposition (CVD), or the like.

In some embodiments, the semiconductor dies 120 have a similar structure as the one just described for the semiconductor dies 110. Briefly, each semiconductor die 120 may include a semiconductor substrate 122 having contact posts 124 formed at a front surface, and a protective layer 126 (temporarily) covering the contact posts 124. However, the disclosure is not limited thereto, and the semiconductor dies 110, 120 do not need to have similar structures to each other. For example, the semiconductor dies 120 may include encapsulated chip stacks, etc. Similarly, the disclosure does not limit the functions for which the semiconductor dies 110, 120 may be configured. For example, the semiconductor dies 110, 120 may each independently be memory dies, such as high-bandwidth memories, for example configured as dynamic random-access memories (DRAMs), resistive random-access memories (RRAMs), static random-access memories (SRAMs), magneto-resistive random-access memories (MRAMs), ferroelectric random-access memories (FRAMs), read-only memory (ROM) or the like; logic dies, such as central processing unit (CPU) dies, graphic processing unit (GPU) dies, micro control unit (MCU) dies, input-output (I/O) dies, baseband (BB) dies, or application processor (AP) dies; microelectromechanical systems, such as sensors or the like; chiplets, and so on.

In some embodiments, dummy dies 130 are disposed over the carrier 100 beside the semiconductor dies 110, 120. In some embodiments, the dummy dies 130 are blocks including semiconductor materials, such as semiconductor materials of the groups III-V of the periodic table. In some embodiments, the dummy dies 130 may include an inorganic material. In some embodiments, the inorganic material includes a metal such as copper or copper alloys, aluminum or aluminum alloys, or a combination thereof. In some embodiments, the inorganic material includes a ceramic material. In some embodiments, the inorganic material includes a glass material containing silicon oxide. In some embodiments, the dummy dies 130 may include multiple layers of different materials, such as an inorganic material, a semiconductor material, and/or an organic polymer.

Referring to FIG. 1C, an encapsulant 140 is formed over the carrier 100. In some embodiments, the encapsulant 140 laterally encapsulates the semiconductor dies 110, 120 and the dummy dies 130. In some embodiments, the encapsulant 140 includes a molding compound, a molding underfill, a resin (such as an epoxy resin), or the like. For example, the encapsulant 140 may include an epoxy resin with fillers (e.g., inorganic fillers such as silica) dispersed therein. In some embodiments, the encapsulant 140 is formed by an over-molding process. In some embodiments, the encapsulant 140 is formed by a compression molding process. In some embodiments, the encapsulant 140 may be initially formed so as to cover the front surfaces 110f, 120f of the semiconductor dies 110, 120. Thereafter, a portion of the encapsulant 140 is removed, for example by a planarization process, until the contact posts 114, 124 of the semiconductor dies 110, 120 are exposed. In some embodiments, portions of the protective layers 116, 126 are removed during the planarization process to expose the corresponding contact posts 114, 124. In some embodiments, the planarization of the encapsulant 140 includes performing a mechanical grinding process and/or a chemical mechanical polishing (CMP) process. Following planarization, the front surfaces 110f, 120f of the semiconductor dies 110, 120 may be defined by the corresponding protective layers 116, 126 and contact posts 114, 124. That is, following the planarization step, the contact posts 114, 124 of the semiconductor dies 110, 120 are exposed and available for electrically connecting the semiconductor dies 110, 120 to subsequently formed components or elements. In some embodiments, the front surfaces 110f, 120f of the semiconductor dies 110, 120 exposing the contact posts 114, 124 are indicated as active surfaces. In some embodiments, the front surfaces 110f, 120f of the semiconductor dies 110, 120 may be substantially coplanar with the top surface 140t of the encapsulant 140. In some embodiments, the encapsulant 140 may cover the dummy dies 130. That is, the top surfaces of the dummy dies 130 may be at a level height lower than the top surface 140t of the encapsulant, such that the dummy dies 130 remain buried within the encapsulant 140.

Referring to FIG. 1D, in some embodiments, a dielectric layer 150 is formed over the encapsulated semiconductor dies 110, 120, on top of the encapsulant 140. In some embodiments, a material of the dielectric layer 150 includes a polyimide, a polybenzooxazole (PBO), an epoxy resin, a phenolic resin, or the like. In some embodiments, the dielectric layer 150 may be blanketly formed on the encapsulant 140 and the semiconductor dies 110, 120, for example via spin-coating or suitable deposition techniques such as chemical vapor deposition (CVD), or the like. In some embodiments, the thickness T150 of the dielectric layer 150 may be about in the range from 1 micrometer to 10 micrometers, but the disclosure is not limited thereto.

Referring to FIG. 1D and FIG. 1E, the dielectric layer 150 may then be patterned to form openings 152 exposing at their bottom the contact posts 114, 124 of the semiconductor dies 110, 120. The patterning process of the dielectric layer 150 to form the openings 152 may be selected according to the material employed for the dielectric layer 150. For example, if the dielectric layer 150 includes photosensitive materials (e.g., photosensitive polyimides), the openings 152 may be formed by a sequence of exposure and development, where auxiliary masks may be employed to determine the pattern of the openings 152. In some alternative embodiments, portions of the dielectric layer 150 may be removed by etching, laser ablation, or other suitable processes.

In FIG. 1F, a seed layer 162a is blanketly formed over the dielectric layer 150. In some embodiments, the seed layer 162a is conformally formed over the dielectric layer 150, lining the openings 152. In some embodiments, the seed layer 162a establishes electrical contact with the contact posts 114, 124. The seed layer 162a may be formed through, for example, a suitable deposition process, such as a physical vapor deposition (PVD) process, an atomic layer deposition (ALD) process, or the like. In some embodiments, the seed layer 162a may include, for example, copper, tantalum, titanium, a combination thereof, or other suitable materials. In some embodiments, a barrier material may be deposited while forming the seed layer 162a to prevent out-diffusion of the material of the seed layer 162a.

In some embodiments, referring to FIG. 1G, a patterned mask 170 is provided on the seed layer 162a, for example via a sequence of deposition, exposure, and development. In some embodiments, a material of the patterned mask 170 includes a positive photoresist or a negative photoresist. In some embodiments, the patterned mask 170 is patterned to include the mask openings 172. The mask openings 172 are formed in correspondence of the openings 152. That is, the portions of the seed layer 162a extending in the openings 152 are exposed by the mask openings 172, as well as portions of the seed layer 162a extending on the dielectric layer 150 around the openings 152.

Referring to FIG. 1H, in some embodiments, a conductive material is formed on the portions of seed layer 162a exposed by the mask openings 172 of the patterned mask 170 to form redistribution patterns 164. The redistribution patterns 164 extend over the dielectric layer 150, and also through the dielectric layer 150 to contact the semiconductor dies 110, 120. In some embodiments, the conductive material of the redistribution patterns 164 may include copper, nickel, tin, palladium, gold, titanium, aluminum, or alloys thereof. In some embodiments, the conductive material of the redistribution patterns 164 may be formed by a plating process. The plating process is, for example, electro-plating, electroless-plating, immersion plating, or the like.

Referring to FIG. 1H and FIG. 1I, the patterned mask 170 and the underlying portions of seed layer 162a may be removed. In some embodiments, the patterned mask 170 may be removed or stripped through, for example, etching, ashing, or other suitable removal processes. Upon removal of the patterned mask 170, the portions of seed layer 162a that are not covered by the redistribution patterns 164 are removed to render the seed layers 162 underneath corresponding redistribution patterns 164. The exposed portions of the seed layer 162a may be removed, for example, through an etching process. In some embodiments, the conductive material of the redistribution patterns 164 may be different from the material of the seed layer 162a, so the portions of the seed layer 162a exposed after removal of the patterned mask 170 may be removed through selective etching. Therefore, the redistribution conductive layer 160 is formed on the dielectric layer 150, and includes the redistribution patterns 164, and, possibly, the underlying seed layers 162. The redistribution patterns 164 may establish electrical connection with the contact posts 114, 124 of the semiconductor dies 110, 120. In some embodiments, the redistribution patterns 164 may interconnect the semiconductor dies 110, 120 with each other. In some embodiments, the redistribution conductive layer 160 may include additional metallic traces (not shown) forming seal rings, alignment marks, or the like. In some embodiments, a thickness T160 of the redistribution conductive layer 160 may be about in the range from 1 micrometer to 10 micrometers. In some embodiments, the thickness T160 is measured in correspondence of regions of the redistribution patterns 164 extending on the dielectric layer 150 where the openings 152 are not formed.

Referring to FIG. 1J, similar process steps to the ones just described with reference from FIG. 1D to FIG. 1I are repeated to form the additional redistribution layers. So, for example, the dielectric layer 180 is formed on the dielectric layer 150 to cover the redistribution conductive layer 160; the redistribution conductive layer 190 is formed extending on and through the dielectric layer 180 to contact the redistribution conductive layer 160; the dielectric layer 200 is formed on the dielectric layer 180 to cover the redistribution conductive layer 190; the redistribution conductive layer 210 is formed extending on and through the dielectric layer 200 to contact the redistribution conductive layer 190; and the dielectric layer 220 is formed on the dielectric layer 200 to cover the redistribution conductive layer 210. Each one of the redistribution conductive layers 190, 210, may include seed layers 192, 212 and corresponding redistribution patterns 194, 214, formed with similar materials and processes as previously described. The dielectric layer 220 may include openings 222 exposing portions of the redistribution patterns 214. In some embodiments, individual thicknesses of the dielectric layers 180, 200, 220 and of the redistribution conductive layers 190, 210 may independently be in the same ranges as previously described for the dielectric layer 150 and the redistribution conductive layer 160, respectively. In some embodiments, the alternately stacked dielectric layers 150, 180, 200, 220 and redistribution conductive layers 160, 190, 210 may be considered a fine-pitch region 230. It will be apparent that the number of dielectric layers 150, 180, 200, 220 and redistribution conductive layers 160, 190, 210 illustrated in FIG. 1J is for illustration purpose, and may be adapted according to routing requirements.

In FIG. 1K, seed layers 242 with overlying redistribution patterns 244 of an additional redistribution conductive layer 240 are formed on the dielectric layer 220, with similar processes and materials as previously described for the redistribution conductive layer 160. By extending in the openings 222, the redistribution conductive layer 240 is connected to the underlying redistribution conductive layer 210. In some embodiments, the thickness T240 of the redistribution conductive layer 240 may be larger than the thicknesses (e.g., the thickness T160) of the underlying redistribution conductive layers 160, 190, 210. For example, the thickness T240 may be about in the range from 5 micrometers to 25 micrometers, as measured in regions of the redistribution conductive layer 240 extending on the dielectric layer 220 where no openings 222 are formed.

In FIG. 1L, a patterned mask 250 is formed on the dielectric layer 220, for example with similar processes and materials as previously described for the patterned mask 170 of FIG. 1G. The patterned mask 250 may be sufficiently thick to cover the redistribution conductive layer 240. Mask openings 252 may be formed in the patterned mask 250 exposing at their bottom sections of the redistribution patterns 244. In FIG. 1M, a conductive material is disposed in the mask openings 252 to form routing vias 246 on the exposed sections of the redistribution patterns 244. In some embodiments, the conductive material of the routing vias 246 may include the same material as the redistribution patterns 244, and may be directly deposited on the redistribution patterns 244. That is, the redistribution patterns 244 may seed the deposition of the conductive material of the routing vias 246. As such, the redistribution conductive layer 240 may include redistribution patterns 244 extending on and through the dielectric layer 220, and routing vias 246 stacked on (and possibly, integral to) the redistribution patterns 244. In some embodiments, no interface may be visible between the redistribution patterns 244 and the routing vias 246. Referring to FIG. 1M and FIG. 1N, the patterned mask 250 may be removed, for example via stripping or ashing, thus exposing again the dielectric layer 220 in the regions where the redistribution conductive layer 240 is blank.

In FIG. 1O, the redistribution conductive layer 240 is embedded in a dielectric layer 260. In some embodiments, the dielectric layer 260 is disposed on the dielectric layer 220, and is formed so that the routing vias 246 of the redistribution conductive layer 240 are exposed at the level height of the top surface 260t of the dielectric layer 260. In some embodiments, the dielectric layer 260 includes a different material than the dielectric layers 150, 180, 200, 220 of the fine-pitch region 230. For example, the dielectric layer 260 may include a molding compound, such as an epoxy resin. In some embodiments, the dielectric layer 260 may include a film material, and be laminated on the dielectric layer 220. In some alternative embodiments, the dielectric layer 260 may be formed by molding. A planarization process (e.g., chemical mechanical polishing, grinding, or the like) may be performed to ensure the routing vias 246 are exposed. In some embodiments, the thickness T260 of the dielectric layer 260 may be larger than the thickness (e.g., the thickness T150) of the dielectric layers 150, 180, 200, 220 of the fine-pitch region 230. For example, the thickness T260 may be about in the range from 10 micrometers to 40 micrometers.

In FIG. 1P, a redistribution conductive layer 270 is formed on the dielectric layer 260 following similar processes as previously described for the redistribution conductive layer 240. Briefly, the seed layers 272 and the redistribution patterns 274 are formed extending on the dielectric layer 260 and the routing vias 246, for example by forming a blanket seed layer (not shown), and then disposing the conductive material of the redistribution patterns 274 in the openings of a patterned mask (not shown). Additional conductive material for forming the routing vias 276 may be disposed in the openings of another patterned mask (not shown), for example by plating using the redistribution patterns 274 as seed. The thickness T270 of the redistribution conductive layer 270 (measured in correspondence of the redistribution patterns 274, where the routing vias 276 are not formed) may also be about in the range from 5 micrometers to about 25 micrometers.

In FIG. 1Q, a dielectric layer 280 is formed on the dielectric layer 260, with similar materials and processes as previously described for the dielectric layer 260. The dielectric layer 280 embeds the redistribution conductive layer 270, and the routing vias 276 are exposed at the top surface 280t of the dielectric layer 280. In some embodiments, the dielectric layers 260, 280 and the redistribution conductive layers 240, 270 may be considered a wide-pitch region 290. In some embodiments, the dielectric layers 260, 280 and the redistribution conductive layers 240, 270 of the wide-pitch region 290 may be thicker than the dielectric layers 150, 180, 200, 220 and the redistribution conductive layers 160, 190, 210 of the fine-pitch region 230, respectively. In some embodiments, the redistribution conductive layers 160, 190, 210 of the fine-pitch region 230 extend through the underlying dielectric layers 150, 180, 200 to contact the underlying redistribution conductive layers 160, 190 or the semiconductor dies 110, 120; in the wide-pitch region 290, however, only the bottommost redistribution conductive layer 240 may extend in the underlying dielectric layer 220, while the upper redistribution conductive layers (e.g., the redistribution conductive layer 270) may extend on (but not through) the underlying dielectric layers (e.g., the dielectric layer 260). In some embodiments, the upper redistribution conductive layers may be contacted by the underlying redistribution conductive layers by routing vias (e.g., the routing via 246) of the underlying redistribution conductive layers. In some embodiments, seed layers (e.g., the seed layer 272) may be considered boundaries of consecutive redistribution conductive layers (e.g., the redistribution conductive layer 240 and the redistribution conductive layer 270). It will be apparent that the number of redistribution conductive layers 240, 270 and dielectric layers 260, 280 of the wide-pitch region 290 illustrated in FIG. 1Q is merely an example, and that fewer or more redistribution conductive layers 240, 270 and dielectric layers 260, 280 may be included according to routing requirements.

In FIG. 1R, an outermost redistribution conductive layer 300 is formed on the wide-pitch region 290, with similar processes and materials as previously described for the redistribution conductive layer 270. In some embodiments, the redistribution conductive layer 300 includes the seed layers 302 and the redistribution patterns 304, but, differently than the redistribution conducive layer 270, it does not include routing vias (such as the routing vias 276, for example). The thickness T300 of the redistribution conductive layer 300 may be comparable to the thicknesses of the redistribution conductive layers 250, and 270, being about in the range from 5 micrometers to 25 micrometers, for example. In some embodiments, the outermost redistribution conductive layer 300 may be considered as a topmost redistribution conductive layer of the wide-pitch region 290.

In FIG. 1S, an outermost dielectric layer 310 is formed on the dielectric layer 280 embedding the redistribution conductive layer 300. In some embodiments, the dielectric layer 310 is formed so as to cover the redistribution conductive layer 300. For example, the dielectric layer 310 may be formed of a thickness T310 about in the range from 20 micrometers to 50 micrometers. In some embodiments, the thickness T310 may be such that the dielectric layer 310 protrudes for a thickness T312 of about 12 micrometers to 18 micrometers on top of the redistribution conductive layer 300. That is, the thickness T310 of the dielectric layer 310 may be about 12 to 18 micrometers greater than the thickness of the redistribution conductive layer 300. In some embodiments, the dielectric layer 310 includes a different material than the dielectric layer 280. In particular, the material of the dielectric layer 310 may be more elastic than the material of the dielectric layer 280. For example, the elasticity (in terms of elongation) of the material of the dielectric layer 310 may be 10 times or more the elasticity of the material of the dielectric layer 280. For example, the dielectric layer 280 may include (or be made of) a material having an elongation of 5% or less, while the dielectric layer 310 may include a material having an elongation of 50% or more. In some embodiments, the elasticity (in terms of tensile stress) of the material of the dielectric layer 310 may be at least 1.5 times the elasticity of the material of the dielectric layer 280. For example, the dielectric layer 280 may include (or be made of) a material having a tensile stress of about 100 MPa or more, while the dielectric layer 310 may include a material having a tensile stress of about 150 MPa or more. In some embodiments, both the elongation and the tensile stress may fall in the above ranges. The elasticity of the dielectric materials may be measured through test such as ASTM D638 or the like. In some embodiments, the dielectric layer 310 includes a polyimide, an epoxy resin, a phenolic resin, a polybenzooxazole, or the like. In some embodiments, the dielectric layer 310 includes a low-curing-temperature polyimide, namely a polyimide that may be cured at temperatures of about 250° C. or less, such as in the range from 200° C. to 230° C. In some embodiments, the dielectric layer 310 may include the same material as the dielectric layers 150, 180, 200, 220 of the fine-pitch region 230. In some embodiments, the dielectric layer 310 may include a material having similar elongation to the material of the dielectric layers 150, 180, 200, 220 of the fine-pitch region 230. In some embodiments, the dielectric layer 310 may be formed according to any suitable process. For example, the dielectric layer 310 may be formed by spin-coating.

In FIG. 1T, openings 312 are formed through the dielectric layer 310. The openings 312 may extend through the dielectric layer 310 for the thickness T312 to expose at their bottom sections of the redistribution patterns 304 of the redistribution conductive layer 300. In some embodiments, the dielectric layer 310 includes a photosensitive material, so that the openings may be formed by exposure and development of the dielectric layer 310. For example, the dielectric layer 310 may include a photosensitive, low-curing-temperature polyimide.

In FIG. 1U, under-bump metallurgies 320 are formed on the dielectric layer 310, extending within the openings 312 of the dielectric layer 310 to contact the redistribution conductive layer 300. In some embodiments, the under-bump metallurgies 320 include portions extending within the openings 312 of the dielectric layer 310 and portions extending on the dielectric layer 310 around the openings 312. In some embodiments, the under-bump metallurgies 320 include seed layers 322 and under-bump pads 324 stacked on the seed layers 322. The under-bump metallurgies 320 may be formed following similar processes as previously described for the redistribution conductive layer 300. Namely, a blanket seed layer may be formed, and the conductive material of the under-bump pads 324 may be disposed on the blanket seed layer within the openings of a patterned mask (not shown). Removal of the patterned mask and the underlying portions of the blanket seed layer leaves the under-bump metallurgies 320. Depending on the size of the openings 312, the under-bump pads 324 may fill the openings 312 (resulting in a substantially flat top surface also in correspondence of the openings 312) or may be conformally disposed within the openings 312 (resulting in a concave shape). It will be understood that while the under-bump metallurgies 320 are illustrated as filling the openings 312, embodiments in which some or all of the under-bump metallurgies 320 are conformal to the openings 312 without completely filling the openings 312 are also contemplated within the disclosure for all the embodiments. Based on the above, the redistribution structure 330 may include the fine-pitch region 230, the wide-pitch region 290, and the elastic dielectric layer 310 sequentially stacked.

Referring to FIG. 1V, in some embodiments, connective terminals 340 are formed on the under-bump metallurgies 320. The connective terminals 340 may include solder balls. For example, solder material may be disposed on the under-bump pads 324, and a reflux step may be performed to form the connective terminals 340. In some embodiments, the solder material of the connective terminals 340 includes eutectic solder containing lead or lead-free. In some embodiments, the solder material of the connective terminals 340 includes non-eutectic solder. In some embodiments, the solder material of the connective terminals 340 contains Sn, SnAg, SnPb, SnAgCu, SnAgZn, SnZn, SnBiIn, SnIn, SnAu, SnCu, SnZnIn, SnAgSb, or similar soldering alloys. In some embodiments, the solder material is applied as a solder paste.

Referring to FIG. 1V and FIG. 1W, in some embodiments, cleaning and refining processes (e.g., trimming at the edges or the like) may be performed to finish the semiconductor device SD10. In some embodiments, the semiconductor device SD10 is a large-scale device, such as a wafer-size (e.g., with a circular footprint) or a panel-size (e.g., with a rectangular footprint) semiconductor device, so that no singulation is performed. In some embodiments, the area of the semiconductor device SD10 may be in the range from 2500 mm$^2$ to 40000 mm$^2$. In some embodiments, the carrier 100 may be removed, for example, following irradiation of the de-bonding layer 102, thus exposing the adhesive layer 104. In some embodiments, the adhesive layer 104 remains in the semiconductor device SD10, however, the disclosure is not limited thereto. In some alternative embodiments, the adhesive layer 104 may be removed, so as to expose the rear surfaces of the semiconductor dies 110, 120, for example to allow installation of heat exchangers (not shown) closer to the semiconductor dies 110, 120, thus promoting dissipation of heat generated during use of the semiconductor device SD10.

Based on the above, the semiconductor device SD10 may be a large-scale reconstructed substrate, including the encapsulated semiconductor dies 110, 120 interconnected to each other by the redistribution structure 330. The redistribution structure 330 may include the fine-pitch region 230, the wide-pitch region 290, and the elastic dielectric layer 310, sequentially stacked. As such, in some embodiments, the redistribution structure 330 includes two sections of dielectric layers (the fine-pitch region 230 and the dielectric layer 310) including a more elastic material than the dielectric layers of the intervening wide-pitch region 290. In some embodiments, the greater elasticity of the dielectric layer 310 allows to dissipate mechanical stress generated when heat is applied, for example during reflow processes or the like. The under-bump metallurgies 320 may be formed on the dielectric layer 310, and extend through the dielectric layer 310 to contact the outermost redistribution conductive layer 300, which is also embedded in the dielectric layer 310. In some embodiments, inclusion of the dielectric layer 310 may also be used to tune the electrical properties of the redistribution conductive layer 300 (and hence, of the connection established through the redistribution conductive layer 300). For example, by reducing the thickness T310 (illustrated, e.g., in FIG. 1T) of the dielectric layer 310 the resistance of the connection may decrease of up to about 26%. Furthermore, by increasing the span of the under-bump metallurgies 320, the capacitance of the connection can also increase of up to about 25%, which may facilitate high-speed signal transmission.

Figure 2A:
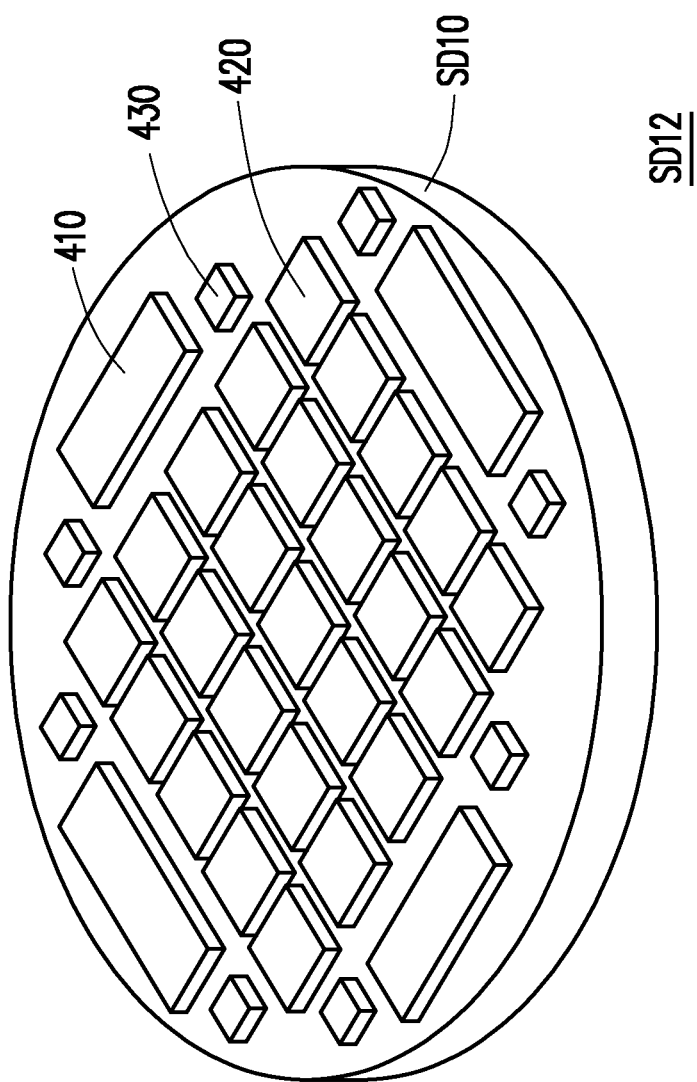
FIG. 2A is a schematic perspective view of a semiconductor device according to some embodiments of the present disclosure.
Figure 2B:
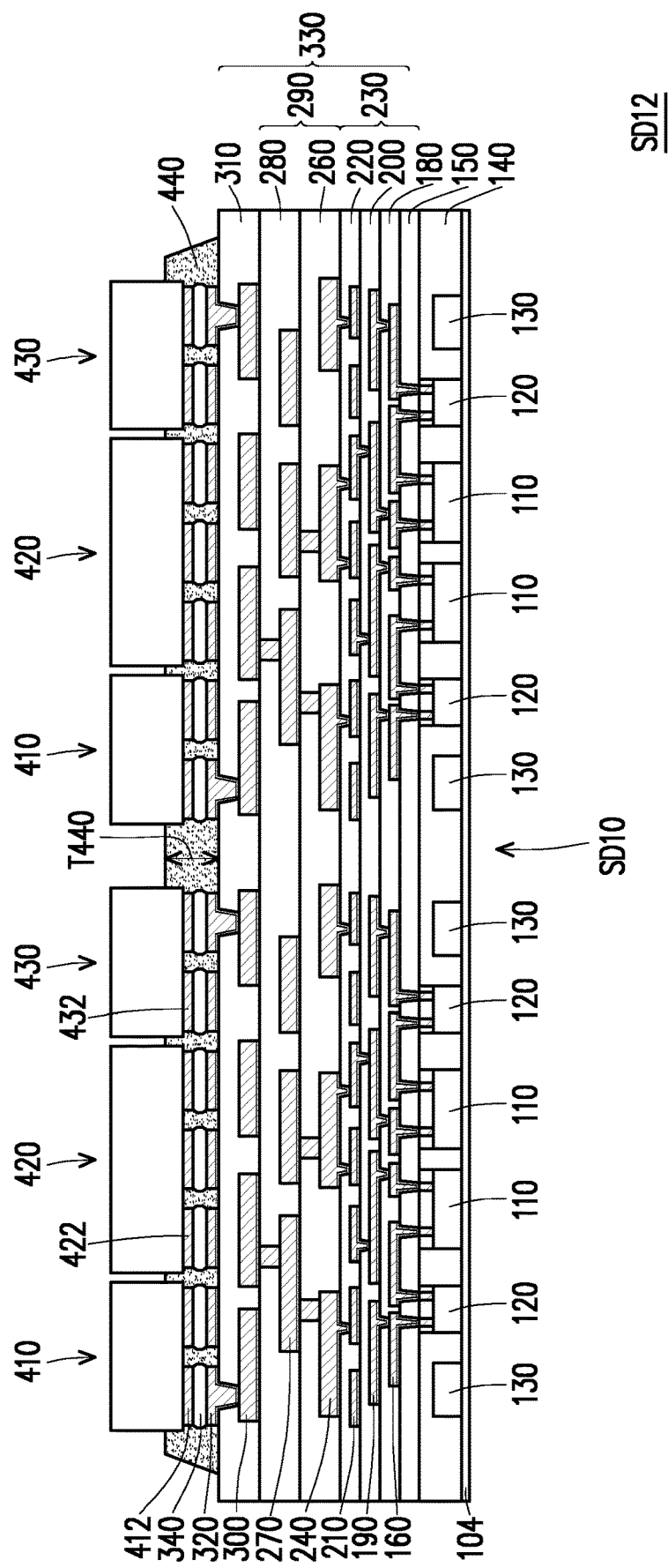
FIG. 2B is a schematic cross-sectional view of a semiconductor device according to some embodiments of the present disclosure

In some embodiments, the redistribution structure 330 may both interconnect the semiconductor dies 110, 120, and also provide for electrical connection to integrate the semiconductor dies 110, 120 within larger devices. For example, FIG. 2A is a schematic perspective view of a semiconductor device SD12 according to some embodiments of the disclosure, and FIG. 2B is a schematic cross-sectional view of the semiconductor device SD12. In some embodiments, the semiconductor device SD12 includes additional packages connected to the redistribution structure 330 of the semiconductor device SD10. For example, the connective terminals 340 may be used to establish electrical connection to one or more of plug connectors 410, functional modules 420, and passive devices 430 on the side of the redistribution structure 330 opposite with respect to the encapsulated semiconductor dies 110, 120. In some embodiments, the functional modules 420 may include any type of chip(s), and perform different functions. In some embodiments, the functional modules 420 may also include organic substrates, such as smaller circuit substrates (e.g., PCBs or the like). For example, at least some of the functional modules 420 may include voltage regulator modules, however the disclosure is not limited thereto.

In some embodiments, these packages 410, 420, 430 are disposed on the redistribution structure 330 with corresponding connective pads 412, 422, 432 contacting the connective terminals 340. A reflow process is then performed to solder together the connective terminals 340 and the connective pads 412, 422, 432, whereby electrical connection between the packages 410, 420, 430 and the redistribution structure 330 (and, hence, the semiconductor dies 110, 120) is established. The reflow process is not particularly limited, and may, for example, apply a temperature of about 200° C. or lower, such as about 180° C., depending on the solder material adopted for the connective terminals 340. After reflow, an underfill 440 may be disposed on the redistribution structure 330 to protect the connective terminals 340 jointed to the connective pads 412, 422, 432. For example, a thickness T440 of the underfill 440 may be about in a range from 250 micrometers to 500 micrometers. In some embodiments, the underfill 440 may be formed by capillary underfill filling, or the like. In some embodiments, the underfill 440 may include an epoxy resin and, optionally, silica fillers dispersed therein. In some embodiments, the underfill 440 may have similar elastic properties to the dielectric layers 260, 280 of the wide-pitch region 290. For example, the elongation of the material of the underfill may be about 5% or less. For example, the tensile stress may be about 100 MPa or more. In some embodiments, both the elongation and the tensile stress may fall in the above ranges. In some embodiments, the elongation of the material of the dielectric layer 310 is at least about 10 times greater than the elongation of the material of the underfill 440. In some embodiments, the tensile stress of the material of the dielectric layer 310 is about 1.5 times or more the tensile stress of the material of the underfill 440. In some embodiments, the material of the dielectric layer 310 has about 10 times or more the elongation and about 1.5 times or more the tensile stress of the material of the underfill 440.

In some embodiments, when the dielectric layer 310 includes (or is made of) an elastic dielectric material such as a low-curing-temperature polyimide, an epoxy resin, a phenol resin, PBO, or the like, or, generally, a material having higher elongation or tensile stress than the dielectric layers 260, 280 of the wide-pitch region 290 and/or the underfill 440, mechanical stress generated during the reflow process may be effectively dissipated, thus reducing or even preventing cracking (e.g., pad lift) within the redistribution structure 330 or the underfill 440. In some embodiments, the material of the dielectric layer 310 may include (or be) a polymeric material having a glass transition temperature of at least 10° C. higher than a reflow temperature applied for bonding the packages 410, 420, 430 to the redistribution structure 330. In some embodiments, the higher glass transition temperature helps to preserve the elastic properties of the dielectric layer 310 during the reflow process, so that the mechanical stress can be effectively dissipated.

Figure 3:
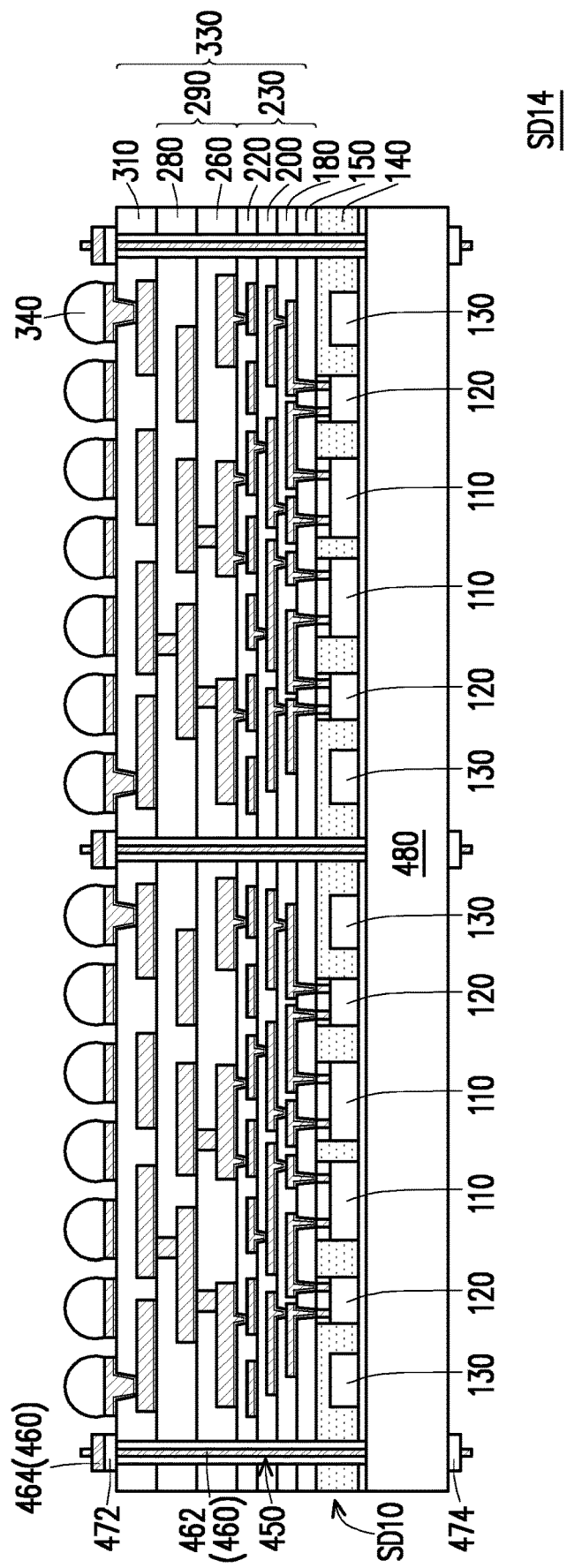
FIG. 3 and FIG. 4 are schematic cross-sectional views of semiconductor devices according to some embodiments of the present disclosure.

FIG. 3 is a schematic cross-sectional view of a semiconductor device SD14 according to some embodiments of the disclosure. In the semiconductor device SD14, fastening holes 450 are formed through the semiconductor device SD10 in a thickness direction, extending through the redistribution structure 330 and the encapsulant 140, to accommodate fasteners (e.g., the screw 460) which secure a heat dissipation module 480. In some embodiments, the fastening holes 450 may be formed in the semiconductor device SD10, for example by laser drilling. In some embodiments, the heat dissipation module 480 is brought into contact with the semiconductor device SD10 from the side of the encapsulant 140, opposite to the redistribution structure 330, and is secured to the semiconductor device SD10 by screws 460. The body 462 of the screws 460 extends through the fastening holes 450, while the head 464 may be disposed at the side of the redistribution structure 330 or at the side of the heat dissipation module 480. Washers 472 and nuts 474 may optionally be used to alleviate biting of the screws heads 464 or keep the screws 460 in place. In some embodiments, by including the heat dissipation module 480 close to the semiconductor dies 110, 120, heat generated during usage of the semiconductor device SD14 may be effectively dissipated.

Figure 4:
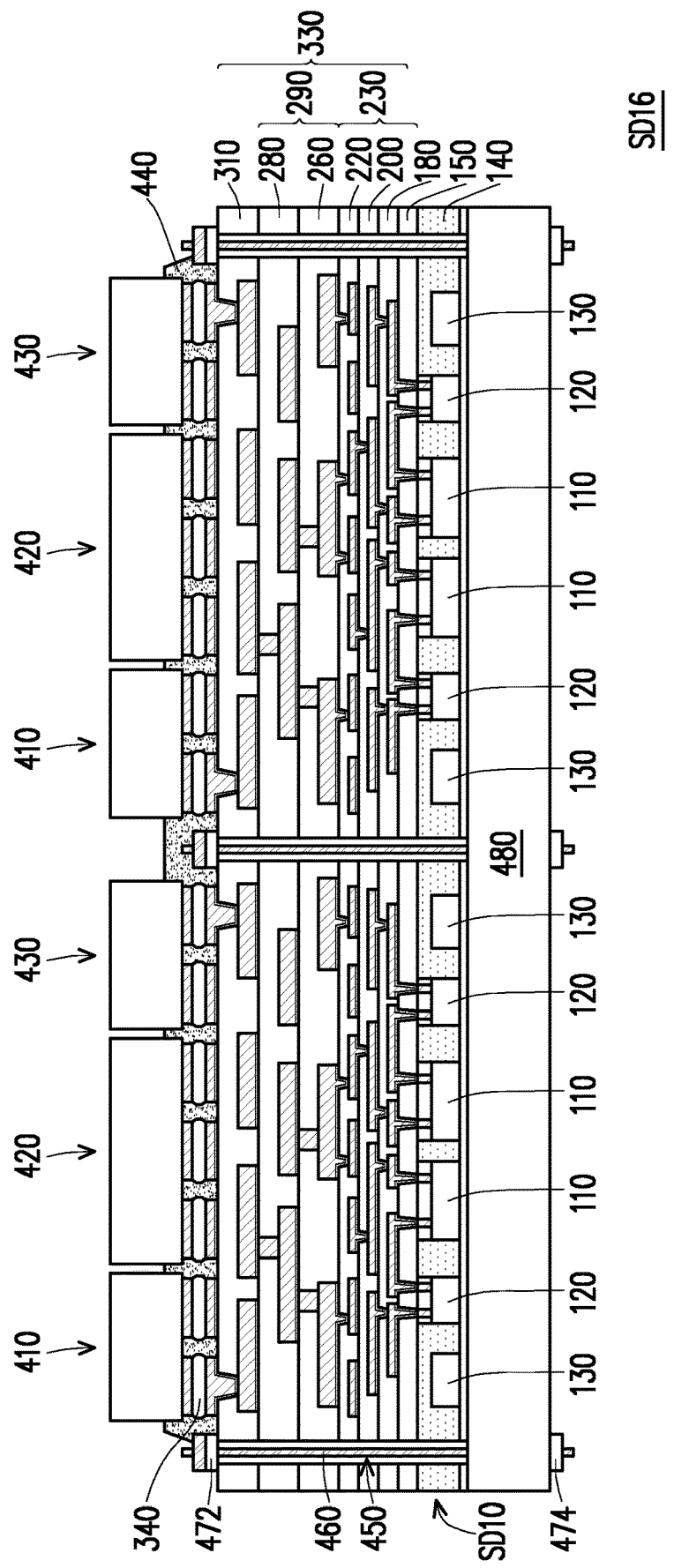

FIG. 4 is a schematic cross-sectional view of a semiconductor device SD16 according to some embodiments of the disclosure. In the semiconductor device SD16, one or more of the packages 410, 420, 430 are connected to the redistribution structure 330, with the underfill 440 protecting the connective terminals 340, as previously described for the semiconductor device SD12 of FIG. 2A. Furthermore, the heat dissipation module 480 is connected on the side of the semiconductor dies 110, 120 as previously described for the semiconductor device SD14 of FIG. 3.

Figure 5A:
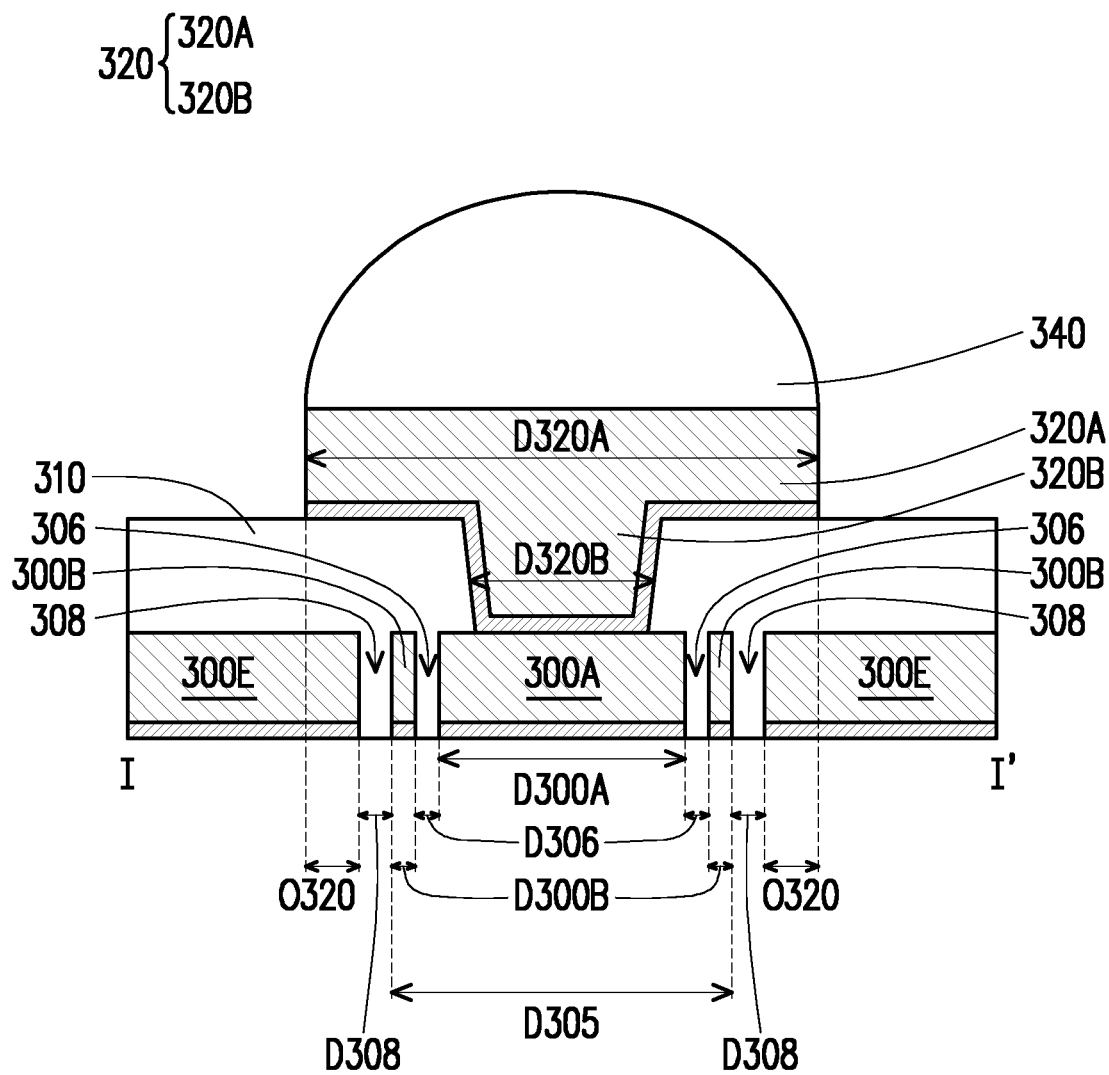
FIG. 5A to FIG. 8 are schematic cross-sectional views of portions of semiconductor devices according to some embodiments of the present disclosure.
Figure 5B:
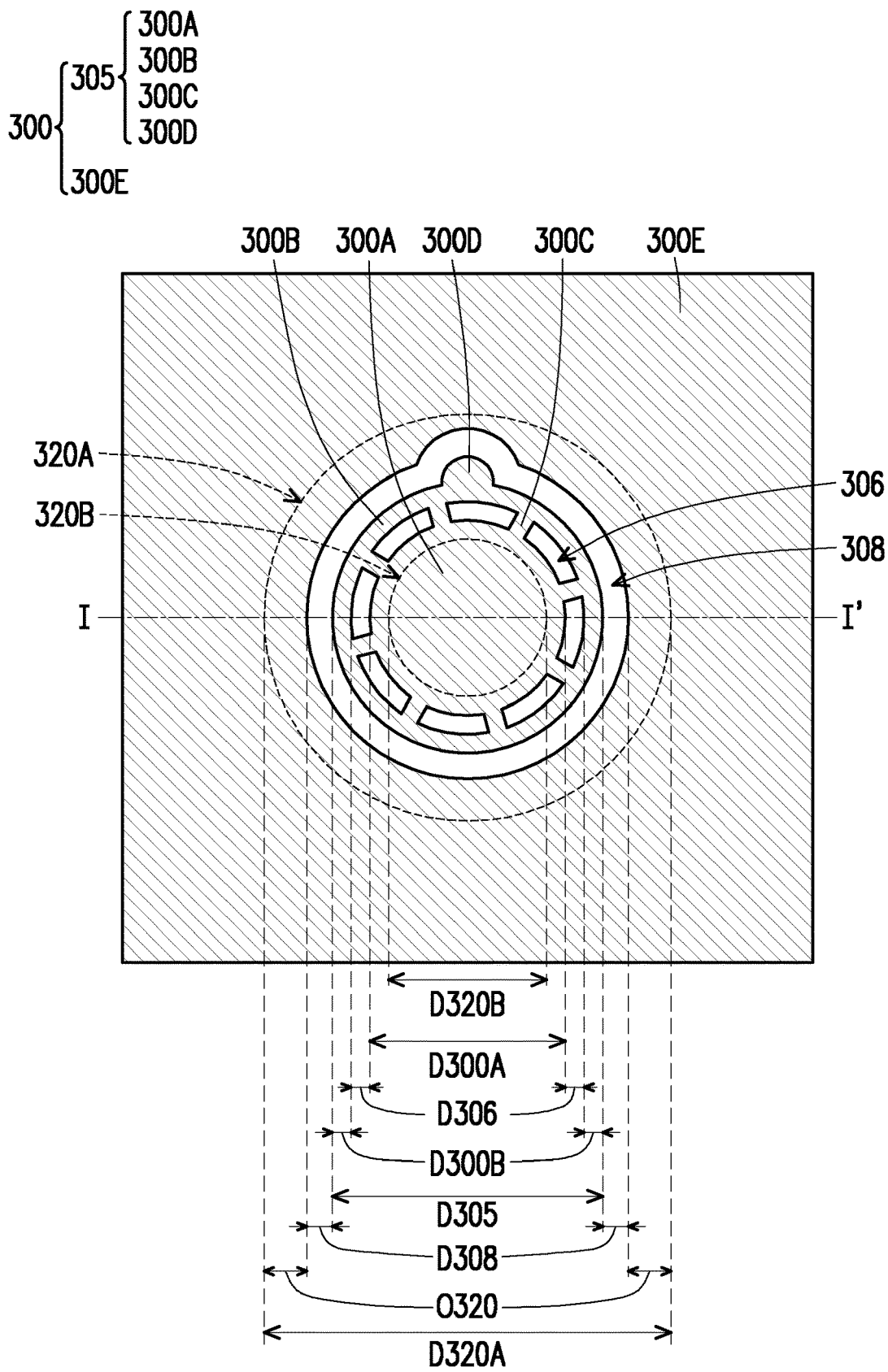

FIG. 5A is a schematic cross-sectional view of a region of a semiconductor device according to some embodiments of the disclosure. For example, the view of FIG. 5A may be the cross-sectional view of a region corresponding to the area A of the semiconductor device SD10 illustrated in FIG. 1W. FIG. 5B is a cross-sectional view of the region illustrated in FIG. 5A, taken in a plane perpendicular with respect to the plane illustrated in FIG. 5A, at a level height extending through the redistribution conductive layer 300. In some embodiments, the under-bump metallurgies 320 include under-bump portions 320A extending on the dielectric layer 310, and via portions 320B extending through the dielectric layer 310 to establish electrical connection to the redistribution conductive layer 300. In some embodiments, the via portions 320B land on the redistribution conductive layer 300 in correspondence of pads 305 which are part of the redistribution conductive layer 300.

In some embodiments, the pads 305 are wheel-pads, comprising a central region 300A and a rim 300B connected by spokes 300C. The central region 300A may be formed, for example, as a disk, and the rim 300B may be an annular region encircling the central region 300A. The spokes 300C may radially depart from the central region 300A, extending from the central region 300A to the rim 300B. Gaps 306 between adjacent spokes 300C may be filled by the dielectric layer 310. In some embodiments, the gaps 306 are shaped as annular arcs, however, the disclosure is not limited thereto, and other shapes of the gaps 306 and spokes 300C may be adopted. In some embodiments, the annular size D306 of the gaps 306 (e.g., the radial thickness of the gaps 306, taken as the difference between the outer radius and the inner radius of the gaps 306, which may also correspond to the radial length of the spokes 300C) may be about in the range from 20 micrometers to 50 micrometers, such as about 30 micrometers. In some embodiments, the pads 305 may be encircled by an isolation trench 308 which separates the pads 305 from the remaining part of the redistribution conductive layer 300, such as a ground plane 300E extending around the isolation trench 308. The isolation trench 308 may be filled by the dielectric layer 310, so that the pad 305 is disconnected from the ground plane 300E, for example when the pad 305 is used to transmit signals to or receive signals from components connected to the overlying connective terminal 340. In some embodiments, the pad 305 may further include protrusions 300D bulging from the rim 300B into the isolation trench 308. The isolation trench 308 may conformally encircle the pad 305, protruding into the ground plane 300E in correspondence of the protrusions 300D.

In some embodiments, the via portion 320B of the under-bump metallurgy 320 may land on the central region 300A. For example, in correspondence of the bottom of the via portion 320B, the size (e.g., the diameter D320B in case of via portions 320B of circular section, or the diagonal in case of rectangular/square sections, etc.) of the via portion 320B may be smaller than the size (e.g., the diameter D300A in case of circular central regions 300A, or the diagonal in case of rectangular/square central regions 300A, etc.) of the central region 300A. For example, a vertical projection of the via portion 320B may fall on and be entirely contained within the span of the central region 300A. For example, the size D300A of the central region 300A may be up to about 10% larger than the size D320B of the via portion 320B (measured, e.g., at about half the distance between the central region 300A and the under-bump portion 320A), such as about 6% larger. For example, the size D320B of the via portion 320B may be about in the range from 300 micrometers to 350 micrometers, such as about 330 micrometers, and the size D300A of the central region 300A may be about in the range from 320 micrometers to 370 micrometers, such as about 350 micrometers. In some embodiments, the annular size D300B (e.g., a thickness of the rim 300B, taken as the difference between the outer radius and the inner radius) of the rim 300B may be about in the range from about 20 micrometers to about 50 micrometers, for example about 30 micrometers. The size D305 of the pad 305 (e.g., the diameter in case of substantially circular shapes, or the diagonal in case of rectangular/square shapes, etc.) may be in the range from about 450 micrometers to about 550 micrometers, such as about 470 micrometers. Similarly, the annular size D308 (e.g., a thickness of the region D308, taken as the difference between the outer radius and the inner radius) of the isolation trench 308 may be in the range from about 20 micrometers to 50 micrometers, such as about 30 micrometers.

In some embodiments, the size D320A (e.g., the diameter in case of substantially circular shapes, or the diagonal in case of rectangular/square shapes, etc.) of the under-bump portion 320A of the under-bump metallurgy 320 may be greater than the size D305 of the pad 305, and may even be greater than the combined sizes of the pad 305 and the insulation trench 308 on both sides of the pad 305 (e.g., D305+2×D308), such that a vertical projection of the under-bump portion 320A fully encompasses the span of the pad 305, and further falls on the ground plane 300E. For example, a certain overlap O320 may exist between the under-bump portion 320A and the ground plane 300E. In some embodiments, the overlap O320 may be about in the range from 20 micrometers to 45 micrometers. In some embodiments, the size D320A of the under-bump portion 320A may be about in the range from 500 micrometers to 570 micrometers. For example, in the configuration illustrated in FIG. 5A and FIG. 5B, the size D320A of the under-bump portion 320A may be about 570 micrometers, so that there is an overlap O320 with the ground plane 300E in an annular region about 20 micrometers thick, as measured from the projection of the edge of the under-bump portion 320A to the outer edge of the insulation trench 308 (e.g., the inner edge of the ground plane 300E). In some embodiments, by having the projection of the edge of the under-bump portion 320A falling on the ground plane 300E (rather than, e.g., on the dielectric layer 310 filling the insulation trench 308), mechanical stress generated during heating processes (e.g., reflow, etc.) may be effectively dissipated. So, for example, stress experienced at the level of the under-bump metallurgies 320 may be reduced up to about 23%. This, in turn, may reduce the final warpage of the semiconductor device (e.g., the semiconductor device SD10 of FIG. 1W, the semiconductor device SD12 of FIG. 2B, the semiconductor device SD14 of FIG. 3, and/or the semiconductor device SD16 of FIG. 4), and may also reduce or even prevent cracks of the redistribution structure 330 (illustrated, e.g., in FIG. 1W).

Figure 6A:
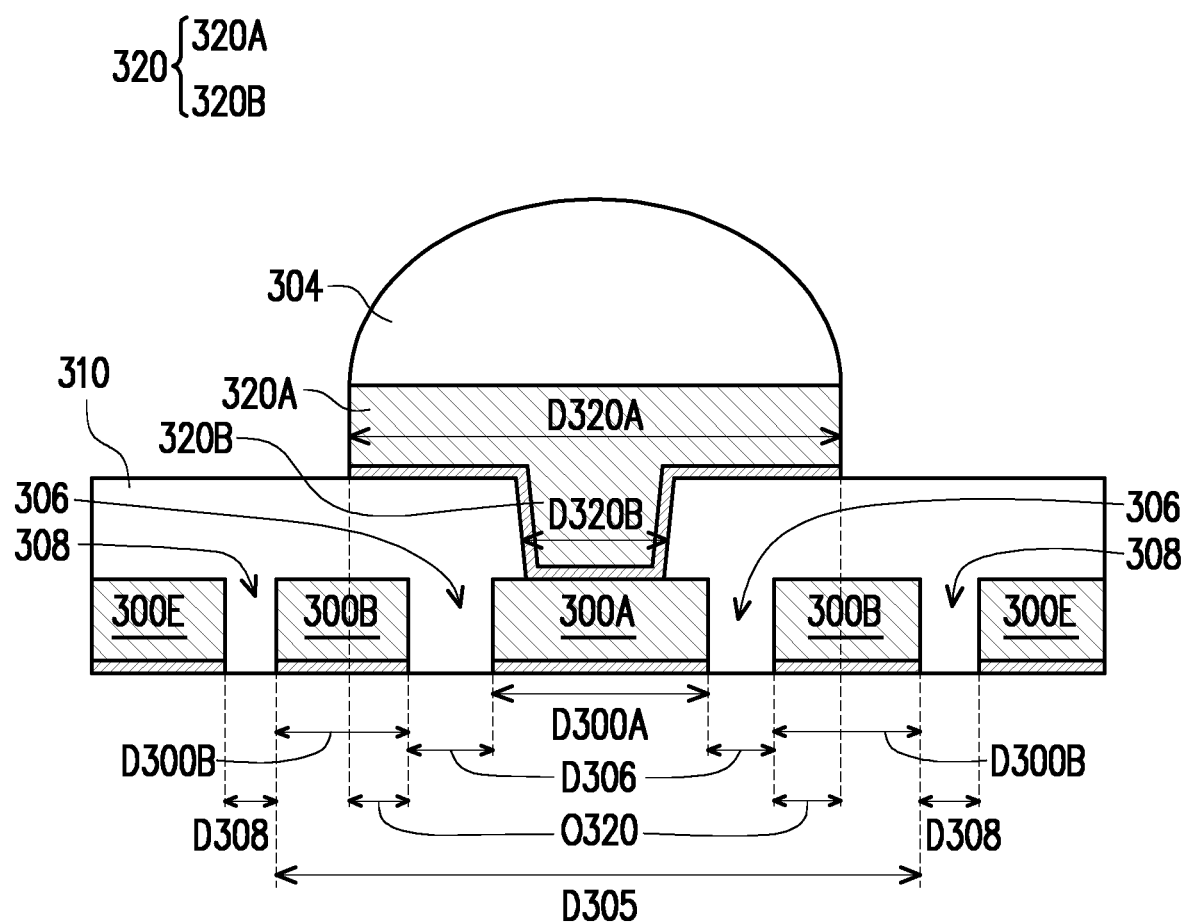
Figure 6B:
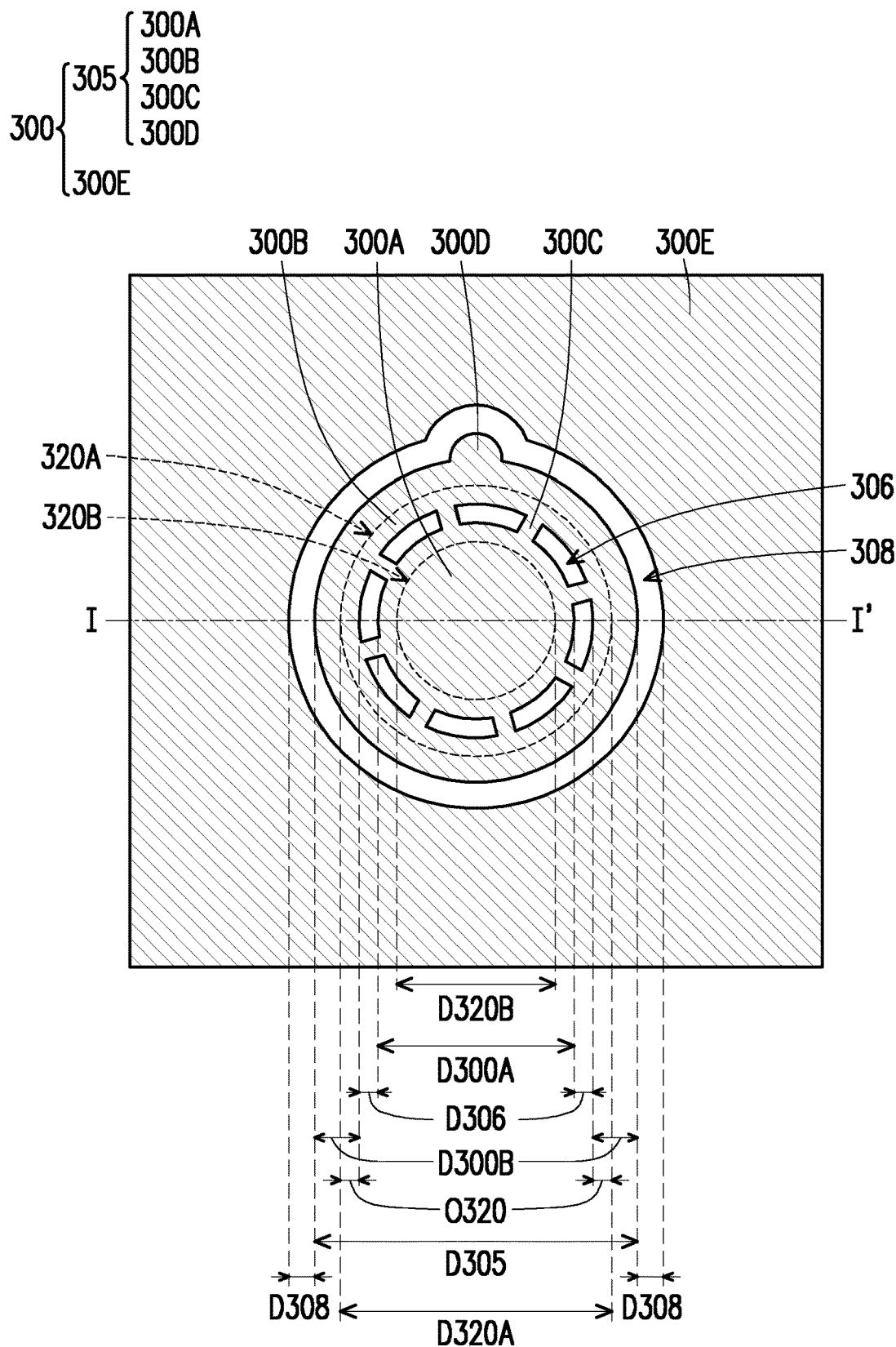

In some embodiments, the configuration of the pad 305 and the dielectric layer 310 may be modified to tune the electrical properties of the pad 305 (and hence, of the connection established through the pad 305). The configuration illustrated in FIG. 5A and FIG. 5B is but one example of possible configurations for the wheel-shaped pads 305 of the redistribution conductive layer 300. For example, another possible configuration is illustrated in FIG. 6A and FIG. 6B. The view of FIG. 6A and FIG. 6B may be the cross-sectional views of regions corresponding to the views of FIG. 5A and FIG. 5B, respectively. In some embodiments, the rim 300B and the spokes 300C may be larger than in the previous configuration, for example with sizes D300B and D306 of about 45 micrometers or ore and 40 micrometers or more, respectively. As such, the pad 305 may be larger in size, for example with a size D305 of about 520 micrometers. In some embodiments, the under-bump portion 320A may be set to be smaller than the pad 305, for example with the size D320A being about 96% of the size D305 of the pad 305. For example, the size D320A may be about 500 micrometers. In such cases, the vertical projection of the under-bump portion 320A may fall entirely within the pad 305. In some embodiments, the sizes D320A, D300A, D300B and D306 are selected so that the projection of the edge of the under-bump portion 320A falls on the rim 300B. For example, the radial thickness of an area of overlap O320 between the under-bump portion 320A and the rim 300B may be about 35 micrometers, as measured from the projection of the edge of the under-bump portion 320A to the outer edges of the gaps 306 (e.g., the inner edge of the rim 300B). The rim 300B may protrude further towards the ground plane 300E with respect to the projection of the edge of the under-bump portion 320A. In some embodiments, by setting the edge of the under-bump portion 320A overlapping with the rim 300B, mechanical stress experienced at the level of the under-bump metallurgies 320 and/or the dielectric layer 310 during heating processes may be effectively dissipated, possibly reducing warpage and reducing or preventing cracking. Other dimensions of the pad 305 and the redistribution conductive layer 300 (e.g., the annular width of the isolation trench 308, the size D320B of the via portion 320B, the size D300A of the central region 300A, etc.) may be similar to the ones previously described for the configuration illustrated in FIG. 5A and FIG. 5B.

Figure 7A:
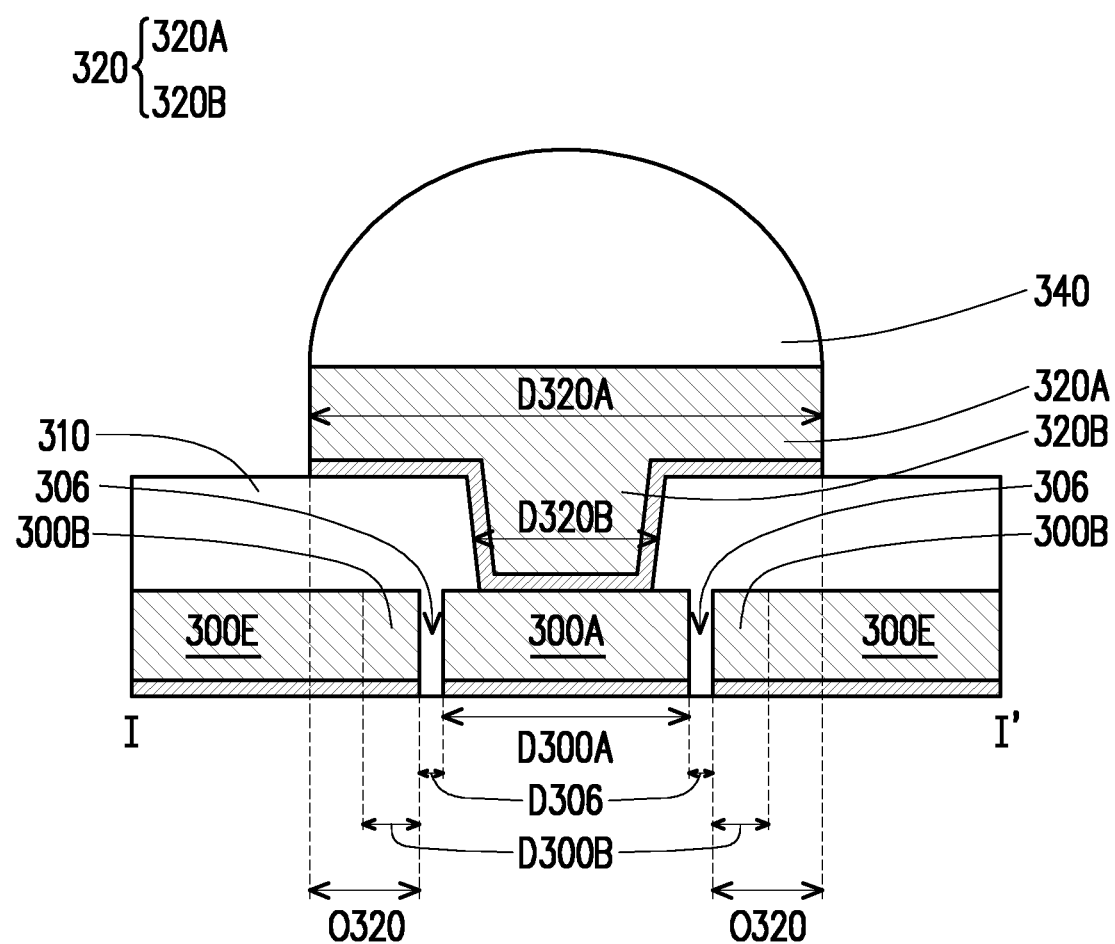
Figure 7B:
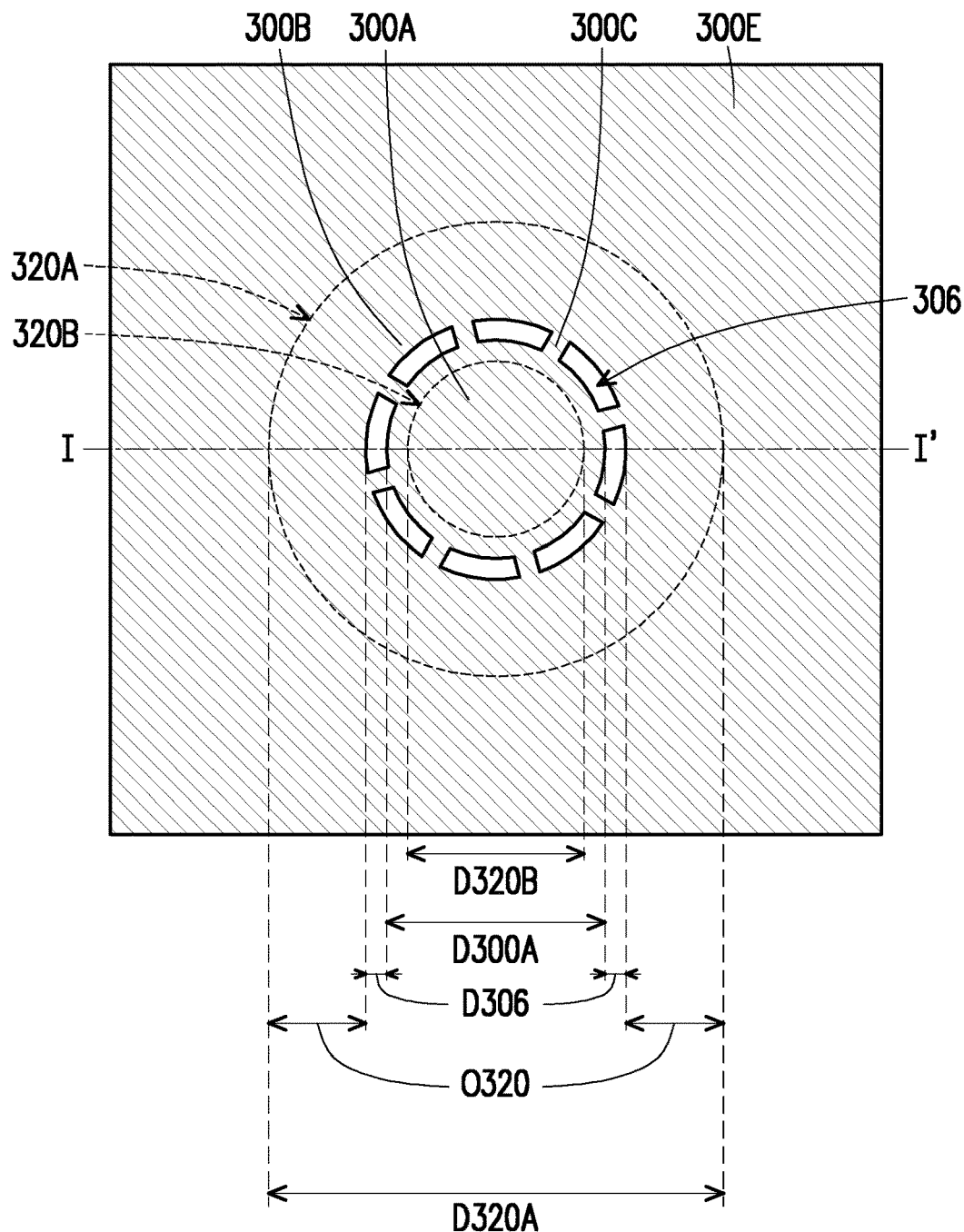

In the configurations illustrated from FIG. 5A to FIG. 6B, the pads 305 are separated from the ground plane 300E by the isolation trenches 308, and may be used, for example, to transmit and receive signals from external components (such as the packages 410, 420, 430 of FIG. 2A and FIG. 4). However, the disclosure is not limited thereto, and, in some alternative embodiments, the pads 305 may be integrated with the ground plane 300E, for example by omitting the isolation trench 308, as illustrated in FIG. 7A and FIG. 7B. The view of FIG. 7A and FIG. 7B may be the cross-sectional views of regions corresponding to the views of FIG. 5A and FIG. 5B, respectively. In some embodiments, the pad 305 still includes the central region 300A from which the spokes 300C radially depart to reach the rim 300B. However, the rim 300B is integral to the ground plane 300E, so as to have only an inner edge in correspondence of the gaps 306. In some embodiments, the vertical projection of the edge of the under-bump portion 320A falls on the ground plane 300E, for example with an overlap O320 (e.g., until the inner edge of the rim 300B) of about 45 micrometers. As such, mechanical stress generated during heating processes may be effectively dispersed. Other dimensions of the pad 305 and the redistribution conductive layer 300 (e.g., the annular width D306 of the gaps 306, the size D320B of the via portion 320B, the size D300A of the central region 300A, etc.) may be the same as previously described for the configuration illustrated in FIG. 5A and FIG. 5B.

Figure 8:
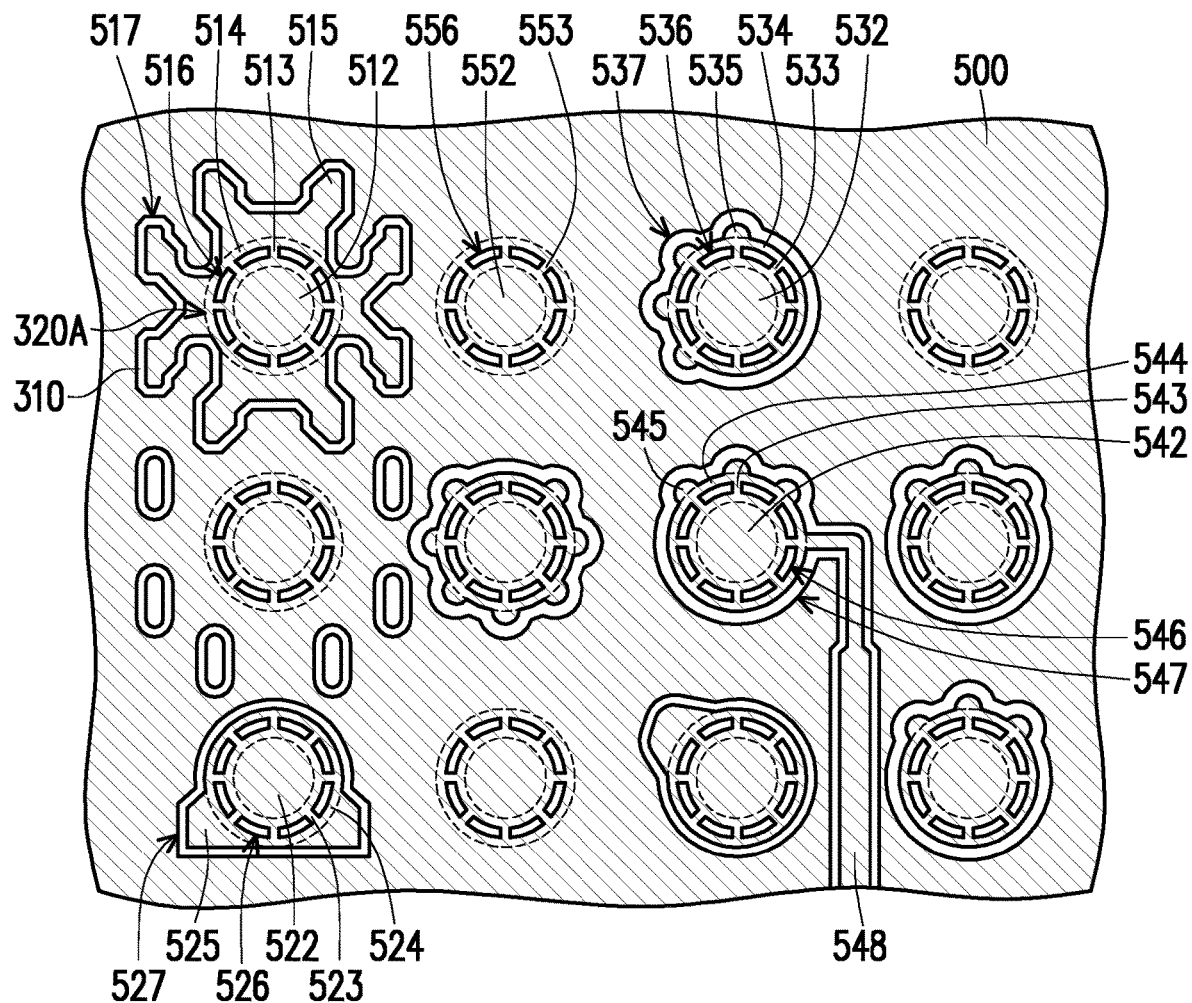

In some embodiments, the configurations illustrated in FIG. 5A to FIG. 7B may be included within a same semiconductor device, for example in different areas of the redistribution conductive layer 300. As a way of example, in FIG. 8 is illustrated a section of an outermost redistribution conductive layer comprising the ground plane 500 and several wheel-shaped pads (e.g., 510, 520, 530, 540, 550) according to the above configurations. For example, the pad 510 may include the central region 512 from which the spokes 513 radially depart to reach the rim 514, which rim 514 includes several protrusions 515 branching out towards the ground plane 500, which confer to the pad 510 a spider-like (or snowflake) appearance. Annular arc gaps 516 are filled by the overlying dielectric layer 310, similar to what was previously described with reference to FIG. 5A and FIG. 5B. The isolation trench 517 reflects the shape of the rim 514 and the protrusions 515, and separates the pad 510 from the ground plane 500. The projection of the edge of the under-bump portion 320A associated with the pad 510 may fall on the rim 514, with a configuration similar to the one illustrated in FIG. 6A. Similarly, the pad 520 includes the central region 522 from which the spokes 523 radially depart to reach the rim 524. The rim 524, in turn, includes a pair of triangular protrusions 525 branching out towards the ground plane 500, conferring to the pad 520 a wing-shaped appearance. The annular arc gaps 526 are formed in between adjacent spokes 523, while the insulation trench 527 conformally encircles the pad 520. As another example, the pad 530 includes the central region 532, the spokes 533 reaching the rim 534, and multiple protrusions 535 bulging from the rim 534. The annular arc gaps 536 are formed in between adjacent spokes 533, while the insulation trench 537 conformally encircles the pad 530. The pads 510, 520, 530 are isolated from the rest of the ground plane 500 by the respective isolation trenches 517, 527, 537, and may be connected to underlying conductive layers (not shown), for example to transmit (or receive) power or signal(s), possibly at high speed. As illustrated by the pads 510, 520, 530, the appearance of wheel-shaped pads and the associated isolation trenches may vary according to application or routing requirements. In some embodiments, pads such as 510, 520, 530 may be referred to as "standalone" pads.

Still referring to FIG. 8, patterns other than pads and ground plane may also be included in the outermost redistribution conductive layer. For example, referring to the pad 540, in addition to the central region 542, the spokes 543, the rim 544, and the protrusion 545, a routing pattern 548 also departs from the rim 544. The routing pattern 548 may be narrower closer to the rim 544, and wider proceeding further away from the rim 544. As in the other pads, the annular arc gaps 546 are formed between adjacent spokes 543. The isolation trench 547 encircles the pad 540, and also separates the routing pattern 548 from the ground plane 500. In some embodiments, the pad 540 with the associated routing pattern 548 may also be used to transmit power or signals. In some embodiments, the pads 510, 520, 530, 540 which transmit power or signals may be configured as illustrated in FIG. 5A and FIG. 5B, or in FIG. 6A and FIG. 6B. The outermost redistribution conductive layer may also include pads (such as the pad 550) which are connected to the ground plane 500, So, for example, the pad 550 includes the central region 552 and the spokes 553 extending from the central region 552 to connect with the ground plane 500, as previously described with reference to FIG. 7A and FIG. 7B. The annular arc gaps 556 are formed between adjacent spokes 553. As illustrated in FIG. 8, several pads such as the pad 550 may be connected to the same ground plane 500, so as to ground the corresponding under-bump metallurgies 320.

FIG. 9A to FIG. 9G are schematic cross-sectional views of structures produced at various stages of a manufacturing method of a semiconductor device SD18 according to some embodiments of the present disclosure. In some embodiments, the structure of FIG. 9A may be obtained from the structure illustrated in FIG. 1Q by forming the redistribution conductive layer 600 following similar processes as previously described for the redistribution conductive layers 240 and 270. Briefly, the seed layers 602 and the redistribution patterns 604 are initially formed, for example by deposition and plating, followed by an additional plating step to form the routing vias 606. The redistribution conductive layer 600 may be formed with similar dimensions to the underlying wide-pitch redistribution conductive layers 240 and 270. In some embodiments, the redistribution patterns 604 may be formed so as to include wheel-shaped pads, as illustrated above with reference from FIG. 5A to FIG. 7B.

Figure 9A:
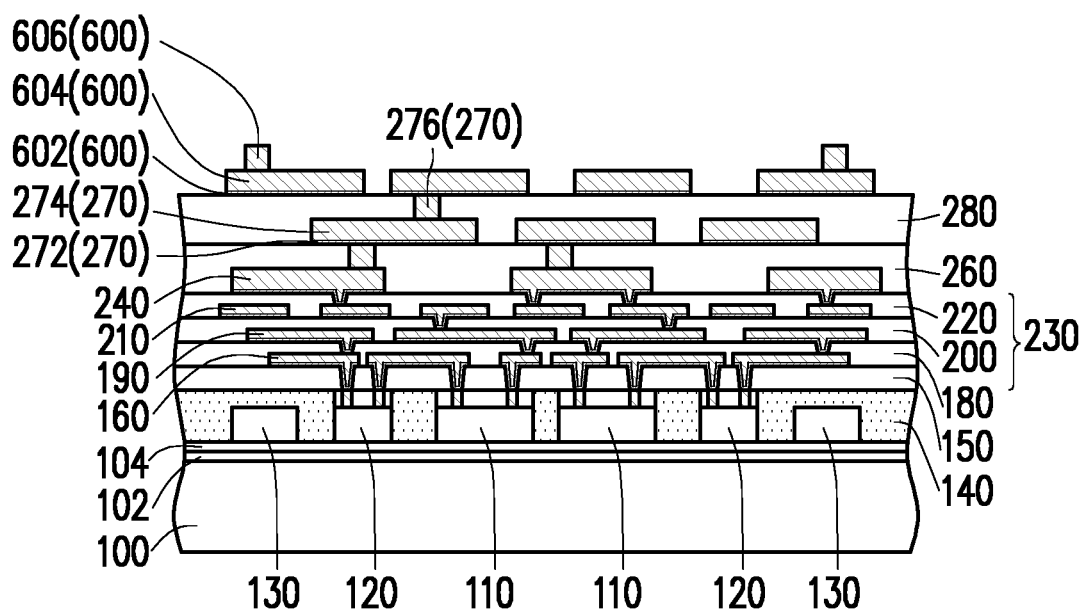
FIG. 9A to FIG. 9G are schematic cross-sectional views of structures produced at various stages of a manufacturing method of a semiconductor device according to some embodiments of the present disclosure.
Figure 9B:
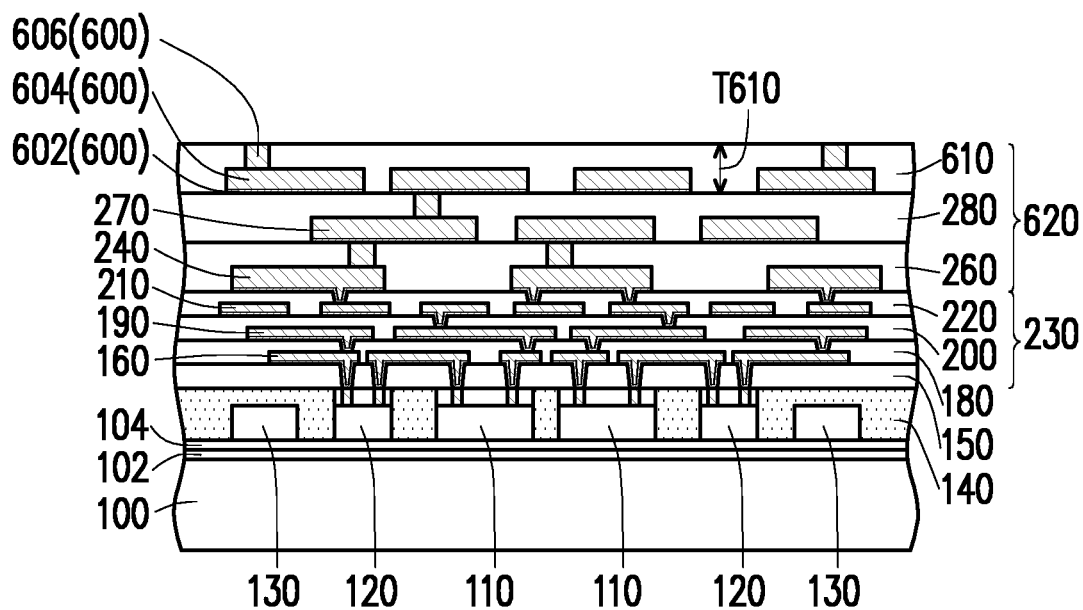

In FIG. 9B, the redistribution conductive layer 600 is embedded in the dielectric layer 610, to form the wide-pitch region 620. The dielectric layer 610 may include similar material and be formed following similar processes as previously described for the other dielectric layers 260, 280 of the wide-pitch region 620. In some embodiments, the thickness T610 of the dielectric layer 610 may be about in the range from 20 micrometers to 50 micrometers.

Figure 9C:
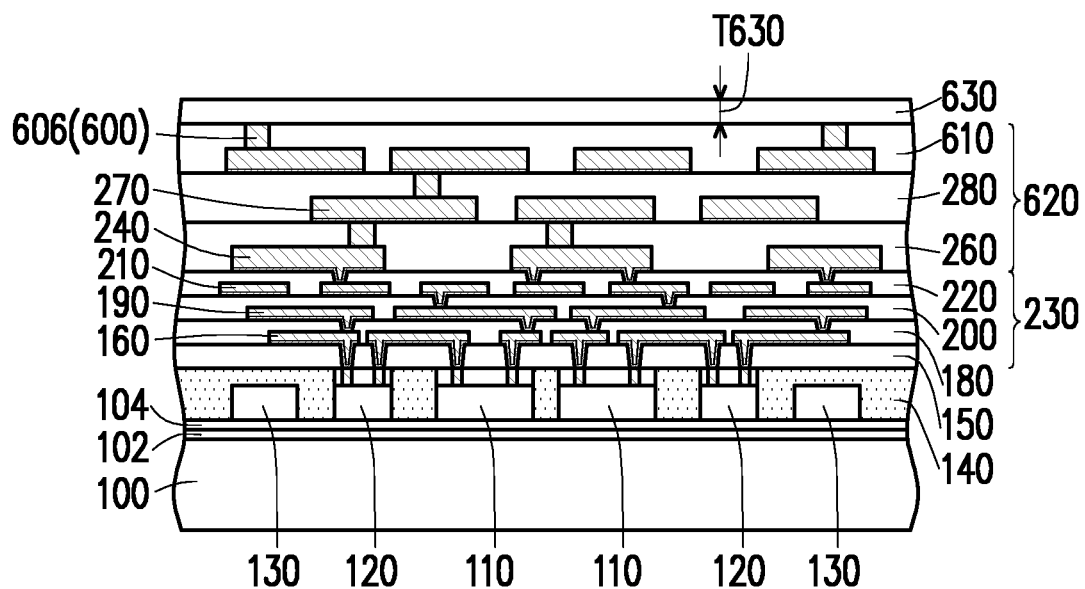

In FIG. 9C, the outermost dielectric layer 630 is formed on the dielectric layer 610, further extending on the routing vias 606 of the redistribution conductive layer 600. For example, the dielectric layer 630 may be formed of a thickness T630 about in the range from 5 micrometers to 20 micrometers. In some embodiments, the dielectric layer 630 includes (or is made of) a different material than the dielectric layers 610, 280, 260 of the wide-pitch region 620. In particular, the material of the dielectric layer 630 may be more elastic than the material of the dielectric layers 610, 260, 280. For example, the elasticity (in terms of elongation) of the material of the dielectric layer 630 may be 10 times or more the elongation of the material of the dielectric layer 610. For example, the dielectric layer 610 may include a material having an elongation of 5% or less, while the dielectric layer 630 may include a material having an elongation of 50% or more. In some embodiments, the elasticity (in terms of tensile stress) of the material of the dielectric layer 630 is about 50% greater than the elasticity of the material of the dielectric layer 610. For example, the tensile stress of the material of the dielectric layer 630 may be greater than 150 MPa, while the material of the dielectric layer 610 may have a tensile stress of about 100 MPa or more. In some embodiments, the material of the dielectric layer 630 may be selected as previously described for the material of the dielectric layer 310 (illustrated, e.g., in FIG.

1W). In some embodiments, the dielectric layer 630 includes a low-temperature polyimide. In some embodiments, the dielectric layer 630 includes the same material as the dielectric layers 150, 180, 200, 220 of the fine-pitch region 230. In some embodiments, the dielectric layer 630 may include a material having similar elongation and/or tensile stress to the material of the dielectric layers 150, 180, 200, 220 of the fine-pitch region 230. In some embodiments, the dielectric layer 630 may be formed according to any suitable process. For example, the dielectric layer 630 may be formed by spin-coating.

Figure 9D:
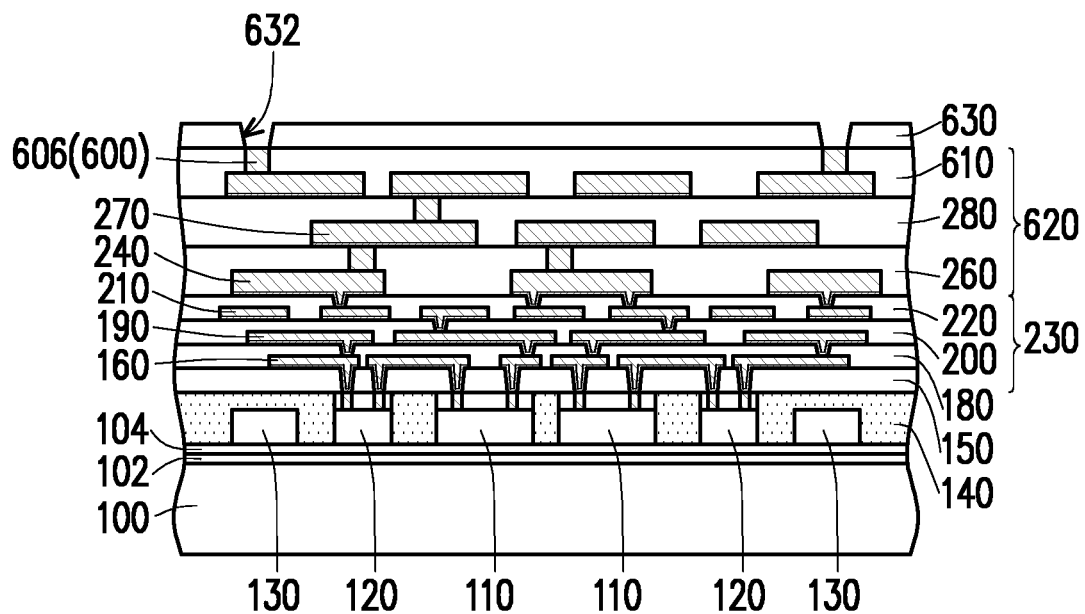

In FIG. 9D, openings 632 are formed through the dielectric layer 630. The openings 632 may extend through the dielectric layer 630 for its entire thickness to expose at their bottom the top surfaces of the routing vias 606 of the redistribution conductive layer 600. In some embodiments, the dielectric layer 630 includes a photosensitive material, so that the openings 632 may be formed by exposure and development of the dielectric layer 630. For example, the dielectric layer 630 may include a photosensitive, low-curing-temperature polyimide.

Figure 9E:
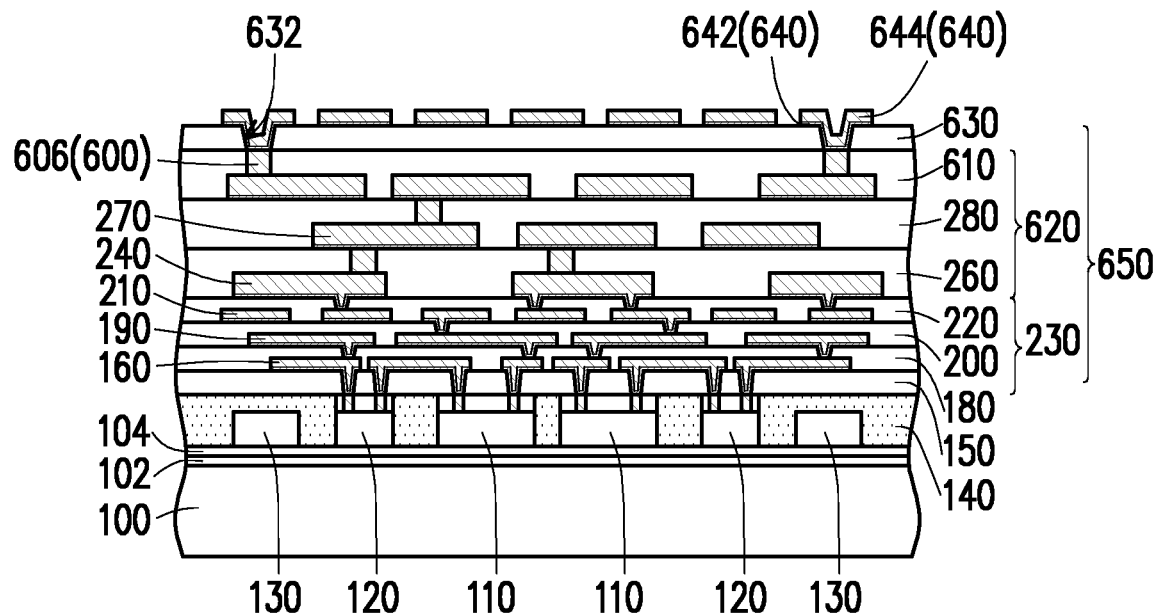

In FIG. 9E, under-bump metallurgies 640 are formed on the dielectric layer 630, extending within the openings 632 of the dielectric layer 630 to contact the redistribution conductive layer 600. In some embodiments, the under-bump metallurgies 640 include portions extending within the openings 632 of the dielectric layer 630 and portions extending on the dielectric layer 630 around the openings 632 (as previously described for the under-bump metallurgies 320, for example with reference to FIG. 5A). In some embodiments, the under-bump metallurgies 640 include seed layers 642 and under-bump pads 644 stacked on the seed layers 642. The under-bump metallurgies 640 may be formed following similar processes as previously described for the under-bump metallurgies 320. Namely, a blanket seed layer may be formed, and the conductive material of the under-bump pads 644 may be disposed on the blanket seed layer within the openings of a patterned mask (not shown). Removal of the patterned mask and the underlying portions of the blanket seed layer leaves the under-bump metallurgies 640. Depending on the size of the openings 632, the under-bump pads 644 may be conformally disposed within the openings 632 (resulting in a concave shape), or may fill the openings 632 (resulting in a substantially flat top surface also in correspondence of the openings 632). From the above, the redistribution structure 650 may include the fine-pitch region 230, the wide-pitch region 620, and the elastic dielectric layer 630 sequentially stacked.

Figure 9F:
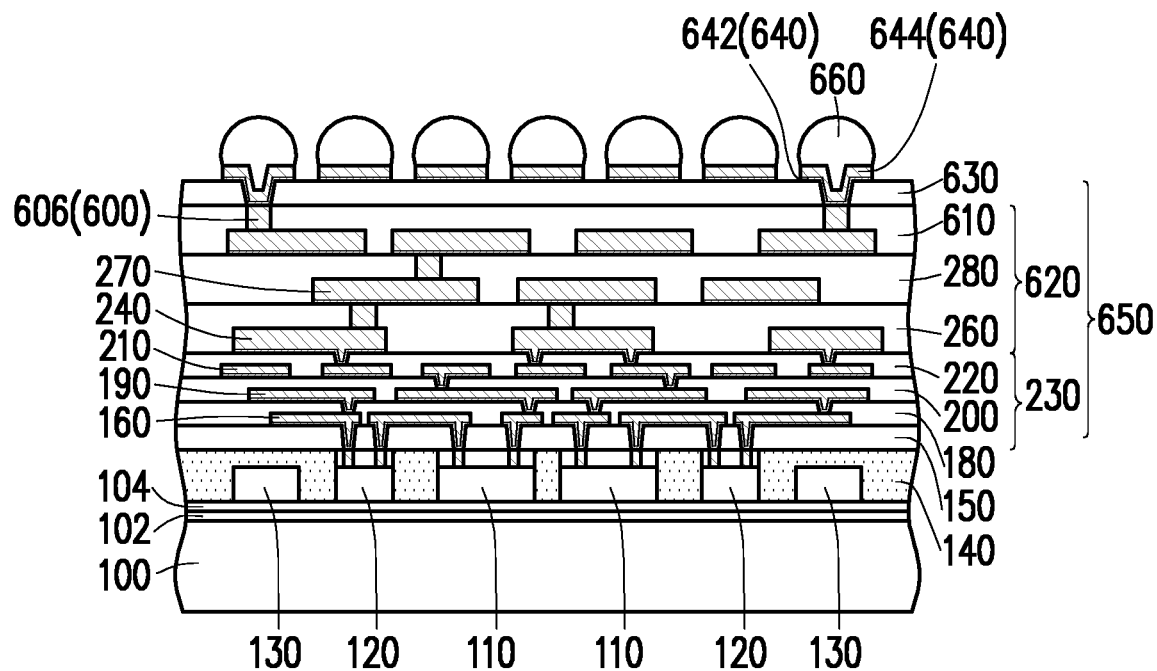

Referring to FIG. 9F, in some embodiments, connective terminals 660 are formed on the under-bump metallurgies 640. The connective terminals 660 may include solder balls. For example, solder material may be disposed on top of the under-bump pads 644, and a reflux step may be performed to form the connective terminals 660. In some embodiments, the solder material of the connective terminals 660 includes eutectic solder containing lead or lead-free. In some embodiments, the solder material of the connective terminals 660 includes non-eutectic solder. In some embodiments, the solder material of the connective terminals 660 contains Sn, SnAg, SnPb, SnAgCu, SnAgZn, SnZn, SnBiIn, SnIn, SnAu, SnCu, SnZnIn, SnAgSb, or similar soldering alloys. In some embodiments, the solder material is applied as a solder paste.

Figure 9G:
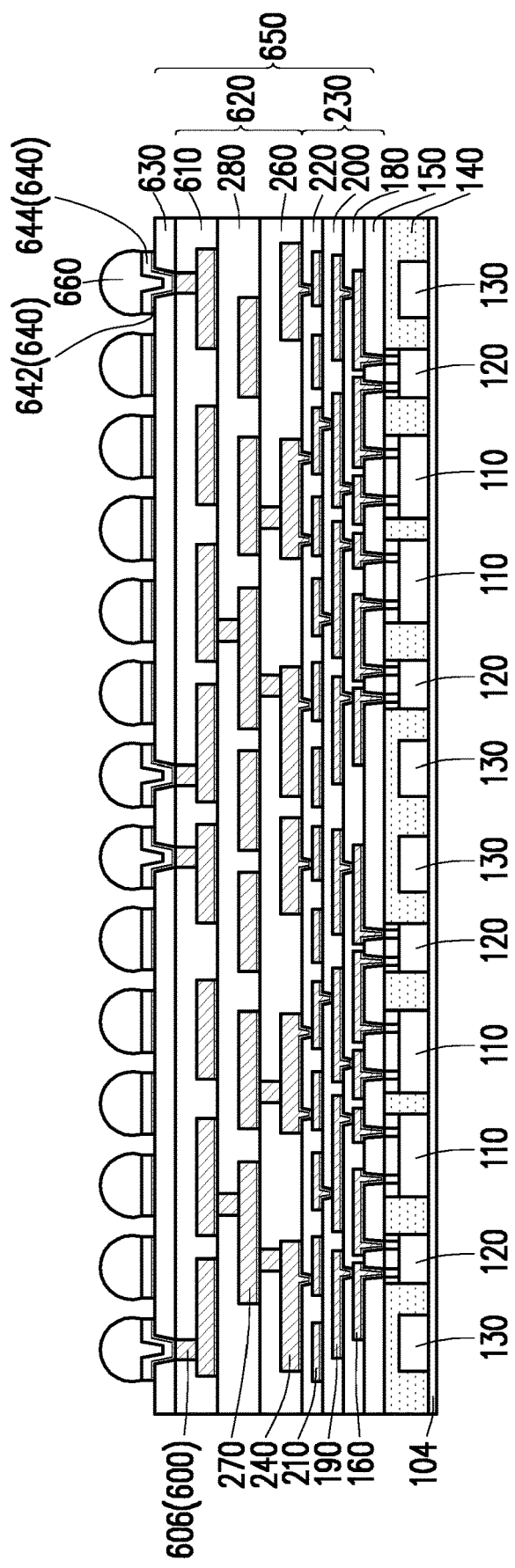

Referring to FIG. 9F and FIG. 9G, in some embodiments, cleaning and refining processes (e.g., trimming at the edges or the like) may be performed to finish the semiconductor device SD18. In some embodiments, the carrier 100 may be removed, for example, following irradiation of the de-bonding layer 102, thus exposing the adhesive layer 104. In some embodiments, the adhesive layer 104 remains in the semiconductor device SD18, however, the disclosure is not limited thereto. In some alternative embodiments, the adhesive layer 104 may be removed, so as to expose the rear surfaces of the semiconductor dies 110, 120, for example to allow installation of heat exchangers (not shown) closer to the semiconductor dies 110, 120, thus promoting dissipation of heat generated during use of the semiconductor device SD10.

Based on the above, the semiconductor device SD18 may be a large-scale reconstructed substrate, including the encapsulated semiconductor dies 110, 120 interconnected to each other by the redistribution structure 650. The redistribution structure 650 may include the fine-pitch region 230, the wide-pitch region 620, and the elastic dielectric layer 630, sequentially stacked. As such, in some embodiments, the redistribution structure 650 includes two sections of dielectric layers (the fine-pitch region 230 and the dielectric layer 630) including more elastic materials than the dielectric layers of the intervening wide-pitch region 620. In some embodiments, the greater elasticity of the dielectric layer 630 allows to dissipate mechanical stress generated when heat is applied, for example during reflow processes or the like. This, in turn, reduces or prevent cracking of the redistribution structure 650 and of underfill material which may be disposed thereon (such as the underfill 440 of FIG. 2B, for example). The under-bump metallurgies 640 may be formed on the dielectric layer 630, and extend through the dielectric layer 630 to land on the routing vias 606 of the outermost redistribution conductive layer 600, which is embedded in a dielectric layer 610 of the wide-pitch region 620.

It will be apparent that features of embodiments previously described may be also applied with respect to the semiconductor device SD18. For example, additional devices (such as the packages 410, 420, 430 in FIG. 2B and FIG. 4) may be connected to the semiconductor device SD18 by way of the connective terminals 660. Similarly, fastening holes such as the ones illustrated in FIG. 3 and FIG. 4 may be formed through the semiconductor device SD18 to secure a heat dissipation module (such as the heat dissipation module 480 of FIG. 3 and FIG. 4). Furthermore, the redistribution patterns 604 of the outermost redistribution conductive layer 600 may be formed so as to include wheel-shaped pads in correspondence of the under-bump metallurgies 640, as previously discussed with reference from FIG. 5A to FIG. 8. In particular, with respect to the embodiments of FIG. 5A to FIG. 7B, the routing vias 606 may be considered an extension of the via portions of the under-bump metallurgies 640, while the routing patterns 604 are formed as the wheel-shaped pads on which the routing vias 606 land. In structures such as the one of FIG. 9G, the arc gaps (e.g., the arc gaps 306 of FIG. 5A) and the isolation trenches (e.g., the isolation trench 308 of FIG. 5A) would be filled by the dielectric layer 610, rather than the elastic dielectric later 630. That is, the outermost redistribution conductive layer 600 would be embedded in the topmost dielectric layer 610 of the wide-pitch region 620.

In accordance with some embodiments of the disclosure, a semiconductor device includes semiconductor dies and a redistribution structure. The semiconductor dies are encapsulated in an encapsulant. The redistribution structure extends on the encapsulant and electrically connects the semiconductor dies. The redistribution structure includes dielectric layers and redistribution conductive layers alternately stacked. An outermost dielectric layer of the dielectric layers further away from the semiconductor dies is made of a first material. A first dielectric layer of the dielectric layers on which the outermost dielectric layer extends is made of a second material different from the first material. The first material includes at least one material selected from the group consisting of an epoxy resin, a phenolic resin, a polybenzooxazole, and a polyimide having a curing temperature lower than 250° C.

In accordance with some embodiments of the disclosure, a semiconductor device includes semiconductor dies, an encapsulant, a redistribution structure, connective terminals, and a package. The encapsulant laterally wraps the semiconductor dies. The redistribution structure extends on the encapsulant and electrically connects the semiconductor dies. The connective terminals are disposed on an opposite side of the redistribution structure with respect to the semiconductor dies. The package is electrically connected to the semiconductor dies via the connective terminals. The redistribution structure includes dielectric layers, redistribution conductive layers, and under-bump metallurgies. The dielectric layers and the redistribution conductive layers are alternately stacked. The under-bump metallurgies are disposed between an outermost dielectric layer of the dielectric layers and the connective terminals. The under-bump metallurgies contact pads formed in an outermost redistribution conductive layer of the redistribution conductive layers. The pads are wheel-shaped pad.

In accordance with some embodiments of the disclosure, a manufacturing method of a semiconductor device includes the following steps. Semiconductor dies are encapsulated in an encapsulant. First dielectric layers and first redistribution conductive layers alternately stacked are formed on the encapsulated semiconductor dies. Second dielectric layers and second redistribution conductive layers alternately stacked are formed on the first dielectric layers and the first redistribution conductive layers. The second dielectric layers and the second redistribution conductive layers are thicker than the first dielectric layers and the first redistribution conductive layers, respectively. An elastic dielectric layer is formed on the second dielectric layers and the second redistribution conductive layers. The elastic dielectric layer includes openings exposing an uppermost redistribution conductive layer of the second redistribution conductive layers. Under-bump metallurgies are formed in the openings of the elastic dielectric layer to electrically contact the uppermost redistribution conductive layer. The elastic dielectric layer includes an elastic dielectric material. An elongation of the elastic dielectric material is at least ten times an elongation of a dielectric material of the second dielectric layers. A tensile stress of the elastic dielectric material is at least 1.5 times a tensile stress of the dielectric material of the second dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   semiconductor dies encapsulated in an encapsulant; and
   a redistribution structure, extending on the encapsulant and electrically connecting the semiconductor dies,
   wherein the redistribution structure comprises dielectric layers and redistribution conductive layers alternately stacked,
   an outermost dielectric layer of the dielectric layers further away from the semiconductor dies is made of a first material,
   a first dielectric layer of the dielectric layers on which the outermost dielectric layer extends is made of a second material different from the first material, and
   the redistribution structure further comprises under-bump metallurgies disposed on the outermost dielectric layer and extending through the outermost dielectric layer to land on wheel-shaped pads of the redistribution conductive layers, wherein the outermost dielectric layer fills in gaps directly under the under-bump metallurgies and penetrating through the wheel-shaped pads to directly contact the first dielectric layer,
   wherein a first under-bump metallurgy of the under-bump metallurgies corresponds to a first wheel-shaped pad of the wheel-shaped pads, and a size of the first under-bump metallurgy is greater than a size of the first wheel-shaped pad.

2. The semiconductor device of claim 1, wherein a tensile stress of the first material is at least 1.5 times a tensile stress of the second material, and a ratio of the size of the first under-bump metallurgy to the size of the first wheel-shaped pad is about in the range from 1.04 to 1.27.

3. The semiconductor device of claim 1, wherein the second material comprises an epoxy resin having fillers dispersed therein.

4. The semiconductor device of claim 1, wherein the under-bump metallurgies land on routing vias of the outermost redistribution conductive layer, and the outermost redistribution conductive layer is embedded in the first dielectric layer.

5. The semiconductor device of claim 1, wherein the under-bump metallurgies contact redistribution patterns of the outermost redistribution conductive layer, and the outermost redistribution conductive layer extends on the first dielectric layer and is embedded in the outermost dielectric layer.

6. The semiconductor device of claim 1, wherein the redistribution structure comprises a fine-pitch region and a wide-pitch region stacked between the encapsulated semiconductor dies and the outermost dielectric layer, dielectric layers and redistribution conductive layers of the fine-pitch region are thinner than dielectric layers and redistribution conductive layers of the wide-pitch region, and the first dielectric layer is part of the wide-pitch region.

7. A semiconductor device, comprising:
   semiconductor dies;
   an encapsulant, laterally wrapping the semiconductor dies;
   a redistribution structure, extending on the encapsulant and electrically connecting the semiconductor dies;
   connective terminals, disposed on an opposite side of the redistribution structure with respect to the semiconductor dies; and
   a package, electrically connected to the semiconductor dies via the connective terminals,
   wherein the redistribution structure comprises:
      dielectric layers and redistribution conductive layers alternately stacked, and under-bump metallurgies disposed between an outermost dielectric layer of the dielectric layers and the connective terminals,
wherein a first under-bump metallurgy of the under-bump metallurgies contacts a first pad of pads formed in an outermost redistribution conductive layer of the redistribution conductive layers, the outermost redistribution conductive layer further comprises a ground plane, the ground plane laterally and fully surrounds the first pad from a plan view of the outermost redistribution conductive layer, and the first pad is electrically disconnected from the ground plane by an isolation trench filled by a first dielectric layer of the dielectric layers.

8. The semiconductor device of claim 7, wherein the first under-bump metallurgy of the under-bump metallurgies comprises:
    a via portion, extending through the outermost dielectric layer, and
    an under-bump portion, extending on the via portion and on the outermost dielectric layer surrounding the via portion,
    wherein the connective terminals are located on the under-bump portions, and
    wherein the first pad of the pads connected to the first under-bump metallurgy comprises:
        a central region, on which a vertical projection of the via portion falls;
        spokes, radially extending from the central region; and
        a rim, connected to the central region by the spokes.

9. The semiconductor device of claim 8, wherein a vertical projection of an edge of the under-bump portion falls on the rim.

10. The semiconductor device of claim 8, wherein a vertical projection of an edge of the under-bump portion falls on the ground plane.

11. The semiconductor device of claim 7, wherein the first dielectric layer is the outermost dielectric layer of the dielectric layers and includes a polyimide having a curing temperature in a range from 200° C. to 230° C. and an elongation of at least 50% or more.

12. The semiconductor device of claim 1, wherein the gaps in the first wheel-shaped pad are within a range of a perimeter of the first under-bump metallurgy.

13. The semiconductor device of claim 12, wherein the redistribution conductive layers further comprise a ground plane, the ground plane laterally surrounds the first wheel-shaped pad, and the first wheel-shaped pad is separated from the ground plane by an isolation trench filled by the outermost dielectric layer.

14. The semiconductor device of claim 8, wherein a vertical projection of the isolation trench falls within an edge of the under-bump portion.

* * * * *